(12) United States Patent
Seo et al.

(10) Patent No.: US 12,490,374 B2
(45) Date of Patent: Dec. 2, 2025

(54) ELECTRONIC DEVICE INCLUDING FLEXIBLE PRINTED CIRCUIT BOARD AND OPERATING METHOD THEREOF

(71) Applicant: SAMSUNG ELECTRONICS CO., LTD., Suwon-si (KR)

(72) Inventors: Bowoong Seo, Suwon-si (KR);
Hokyung Kang, Suwon-si (KR);
Yongwoon Kim, Suwon-si (KR);
Jonghoon Woo, Suwon-si (KR);
Jinwan An, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 200 days.

(21) Appl. No.: 18/230,027

(22) Filed: Aug. 3, 2023

(65) Prior Publication Data

US 2024/0007551 A1    Jan. 4, 2024

Related U.S. Application Data

(63) Continuation of application No. PCT/KR2023/008250, filed on Jun. 15, 2023.

(30) Foreign Application Priority Data

Jun. 30, 2022 (KR) .................. 10-2022-0080169
Jul. 20, 2022 (KR) .................. 10-2022-0089644

(51) Int. Cl.
*H05K 1/02* (2006.01)

(52) U.S. Cl.
CPC .......... *H05K 1/028* (2013.01); *H05K 2201/05* (2013.01); *H05K 2201/10128* (2013.01);
(Continued)

(58) Field of Classification Search
CPC .. G06F 1/1652; G06F 1/1677; H04M 1/0268; H04M 1/0216; H05K 1/028;
(Continued)

(56) References Cited

U.S. PATENT DOCUMENTS 10,063,677 B2 *  8/2018  Cavallaro ............. G06F 1/1626
10,679,536 B2 *  6/2020  Lee ....................... G09G 3/3275
(Continued)

FOREIGN PATENT DOCUMENTS

JP      2017-107478 A      6/2017
KR  10-2017-0026046 A      3/2017
(Continued)

OTHER PUBLICATIONS

Giancarlo Orengo et al., "Modeling Wearable Bend Sensor Behavior for Human Motion Capture", IEEE Sensors Journal, vol. 14, No. 7, Jul. 2014, 10 pages, https://ieeexplore.ieee.org/abstract/document/6756963).

(Continued)

*Primary Examiner* — James Wu
(74) *Attorney, Agent, or Firm* — Sughrue Mion, PLLC

(57) ABSTRACT

A foldable electronic device includes a display including a first and second areas; a first and second housings; a hinge structure foldably connecting the first housing and the second housing to each other on a folding axis; a flexible printed circuit board (FPCB) extending across the folding axis from a first space between the first housing and the display to a second space between the second housing and the display and including a first bending portion and a second bending portion; a sensor configured to identify an impedance in the FPCB; and a processor configured to identify a folding angle between the first housing and the second housing based on the impedance. The first bending portion includes a first sensing pattern part including a first (Continued)

pattern forming a first electrical path and a second pattern forming a second electrical path.

18 Claims, 25 Drawing Sheets

(52) U.S. Cl.
CPC .............. *H05K 2201/10151* (2013.01); *H05K 2201/10204* (2013.01)

(58) Field of Classification Search
CPC ..... H05K 2201/05; H05K 2201/10151; H05K 2201/10204; H05K 2201/10128
See application file for complete search history.

(56) References Cited

U.S. PATENT DOCUMENTS

| | | | | |
|---|---|---|---|---|
| 10,736,211 | B2* | 8/2020 | Park | .................. G06F 1/1683 |
| 11,353,922 | B2* | 6/2022 | Lee | .................. H04M 1/0277 |
| 2020/0340794 | A1 | 10/2020 | Park | |
| 2021/0247806 | A1 | 8/2021 | Lee et al. | |
| 2023/0176803 | A1 | 6/2023 | Jin et al. | |
| 2024/0241398 | A1* | 7/2024 | Large | ................... H10K 77/111 |

FOREIGN PATENT DOCUMENTS

| | | | |
|---|---|---|---|
| KR | 10-2018-0089229 A | 8/2018 | |
| KR | 10-2020-0018065 A | 2/2020 | |
| KR | 10-2020-0021172 A | 2/2020 | |
| KR | 10-2020-0126317 A | 11/2020 | |
| KR | 10-2021-0092089 A | 7/2021 | |
| KR | 10-2021-0101669 A | 8/2021 | |
| KR | 10-2022-0017078 A | 2/2022 | |
| KR | 10-2379186 B1 | 3/2022 | |

OTHER PUBLICATIONS

Frederick W. Grover, "Inductance Calculations: Working Formulas and Tables", 1946, 11 pages, https://books.google.co.kr/booksid=K3KHi9llltsC&lpg=PZ13&ots=dP_IN1puQg&Ir&pg=PZ13#v=onepage&q&f=false.

International Search Report (PCT/ISA/210) issued on Sep. 19, 2023 by the International Searching Authority in International Patent Application No. PCT/KR2023/008250.

* cited by examiner

ELECTRONIC DEVICE INCLUDING FLEXIBLE PRINTED CIRCUIT BOARD AND OPERATING METHOD THEREOF

CROSS-REFERENCE TO RELATED APPLICATIONS

This application is a continuation application of International Application No. PCT/KR2023/008250 designating the United States, filed on Jun. 15, 2023, in the Korean Intellectual Property Receiving Office and claiming priority to Korean Patent Application No. 10-2022-00080169, filed on Jun. 30, 2022, and Korean Patent Application No. 10-2022-0089644, filed on Jul. 20, 2022, in the Korean Intellectual Property Office, the disclosures of which are incorporated by reference herein in their entireties.

BACKGROUND

1. Field

The disclosure relates to a foldable electronic device including a flexible printed circuit board and an operating method thereof.

2. Description of Related Art

There is a continuous demand for electronic devices with various designs and functions to provide electronic devices with reduced size and increased functionality. For example, foldable electronic devices that may be transformed in size and manipulated between various configurations are being researched. To electrically connect various components inside a foldable electronic device to each other, a flexible printed circuit board (FPCB) of which the shape is able to be flexibly transformed may be used.

SUMMARY

In accordance with an aspect of the disclosure, a foldable electronic device includes: a display including a first area and a second area; a first housing on a rear surface of the first area; a second housing on a rear surface of the second area; a hinge structure foldably connecting the first housing and the second housing to each other on a folding axis; a flexible printed circuit board (FPCB) extending across the folding axis from a first space between the first housing and the display to a second space between the second housing and the display and including a first bending portion and a second bending portion, wherein the first bending portion includes a first sensing pattern part including a first pattern forming a first electrical path and a second pattern forming a second electrical path; a sensor configured to identify an impedance in the FPCB; and a processor configured to identify a folding angle between the first housing and the second housing based on the impedance.

The first electrical path may extend in a first direction perpendicular to a surface of the FPCB. The second electrical path may extend in a second direction parallel with the surface of the FPCB.

The first pattern may include: a plurality of vertical conductive lines extending in a first direction perpendicular to a surface of the FPCB; and at least one horizontal conductive line extending in a second direction parallel with the surface of the FPCB and connected to the plurality of vertical conductive lines.

At least one of the plurality of vertical conductive lines may include a via.

The FPCB may include a plurality of layers stacked in a first direction perpendicular to a surface of the FPCB. The first pattern may include: horizontal conductive lines respectively formed in some of the plurality of layers; and a via penetrating the plurality of layers to connect adjacent horizontal conductive lines to each other.

The second pattern may include: a plurality of first conductive lines spaced apart from each other and extending in a second direction parallel with a surface of the FPCB; and at least one second conductive line connecting adjacent first conductive lines to one another.

The second direction may be perpendicular to the folding axis.

The FPCB may include a plurality of layers stacked in a first direction perpendicular to a surface of the FPCB, and the second pattern may be provided in a layer forming the surface of the FPCB.

The hinge structure may include a hinge along the folding axis. The FPCB may include: a central portion in a hinge space between the hinge and the display. The first bending portion may be connected to a first end of the central portion and may extend to the first space. The second bending portion may be connected to a second end of the central portion and may extend to the second space. The FPCB may also include a first extension portion extending from the first bending portion and including a first fixing part fixed to the first space; and a second extension portion extending from the second bending portion and including a second fixing part fixed to the second space.

The first pattern may be between the central portion and the second pattern.

The FPCB may include a dummy pattern, and the sensor may be configured to identify a reference impedance of the dummy pattern.

The processor may be further configured to identify the folding angle based on the impedance and the reference impedance.

The second bending portion may include a second sensing pattern part that includes a third pattern forming a third electrical path and a fourth pattern forming a fourth electrical path.

The first sensing pattern part and the second sensing pattern part may be arranged on different surfaces of the FPCB.

The processor may be further configured to calculate a first angle based on information on a first impedance of the first sensing pattern part, calculate a second angle based on a second impedance of the second sensing pattern part, and identify the folding angle based on the first angle and the second angle, and wherein the folding angle is between the first angle and the second angle.

In accordance with an aspect of the disclosure, an operating method of a foldable electronic device may include: identifying an impedance of a sensing pattern part provided in a bending portion of a flexible printed circuit board (FPCB) in response to a folding operation of the foldable electronic device; identifying a folding angle of the foldable electronic device based on the impedance of the sensing pattern part; and changing an operating mode of the foldable electronic device based on the folding angle.

The sensing pattern part may include a first pattern forming a first electrical path extending in a first direction perpendicular to a surface of the FPCB and a second pattern forming a second electrical path extending in a second direction parallel with the surface of the FPCB, and the identifying the impedance may include detecting a first impedance of the first pattern and a second impedance of the second pattern.

The identifying the folding angle may include: identifying a preliminary folding angle based on the impedance; and selecting a reference angle adjacent to the preliminary folding angle from among a set of reference angles.

The sensing pattern part may be one from among a plurality of sensing pattern parts provided in the FPCB, and the recognizing of the folding angle of the foldable electronic device may further include: identifying a plurality of preliminary folding angles based on a plurality of impedances respectively corresponding to the plurality of sensing pattern parts; and identifying a mean value of the plurality of preliminary folding angles as the folding angle.

In accordance with an aspect of the disclosure, a foldable electronic device including: a display including a first area and a second area; a first housing on a rear surface of the first area; a second housing on a rear surface of the second area; a hinge structure foldably connecting the first housing and the second housing to each other on a folding axis; a flexible printed circuit board (FPCB) extending across the folding axis from a first space between the first housing and the display to a second space between the second housing and the display; a sensor configured to identify an impedance in the FPCB; and a processor configured to identify a folding angle based on the impedance. The hinge structure forms a hinge space between the first space and the second space. The FPCB includes: a central portion in the hinge space; a first bending portion connected to a first end of the central portion; a second bending portion connected to a second end of the central portion; and a sensing pattern part provided in the first bending portion. The sensing pattern part includes: a first pattern extending in a first direction perpendicular to a surface of the FPCB; and a second pattern extending in a second direction parallel with the surface of the FPCB.

In accordance with an aspect of the disclosure, a non-transitory computer readable medium having instructions stored therein, which when executed by a processor cause the processor to execute a method of controlling a foldable electronic device, the method including: identifying an impedance of a sensing pattern part provided in a bending portion of a flexible printed circuit board (FPCB) in response to a folding operation of the foldable electronic device; identifying a folding angle of the foldable electronic device based on the impedance of the sensing pattern part; and changing an operating mode of the foldable electronic device based on the folding angle.

In accordance with an aspect of the disclosure, a foldable electronic device including: a display; a first housing on a first area of the display; a second housing on a second area of the display; a hinge rotatably connecting the first housing with the second housing; a flexible printed circuit board (FPCB) extending from a first space between the first area and the first housing to a second space between the second area and the second housing; and a processor configured to: identify a folding angle between the first housing and the second housing based on a first impedance in the FPCB.

The processor may be further configured to identify the folding angle based on the first impedance and a second impedance in the FPCB.

The foldable electronic device may further include a first sensing pattern provided in a first bending portion of the FPCB; and a reference pattern provided in the FPCB. The processor may be further configured to identify the first impedance based on the first sensing pattern and the second impedance based on the reference pattern.

A shape of the reference pattern may be constant throughout a folding operation of the foldable electronic device.

The foldable electronic device may further include a second sensing pattern provided in a second bending portion of the FPCB. The processor is further configured to identify a third impedance based on the second sensing pattern, and identify the folding angle based on the first impedance, the second impedance and the second impedance.

BRIEF DESCRIPTION OF DRAWINGS

The above and other aspects, features, and advantages of certain embodiments of the present disclosure will be more apparent from the following description, taken in conjunction with the accompanying drawings, in which.

DETAILED DESCRIPTION

Figure 1:
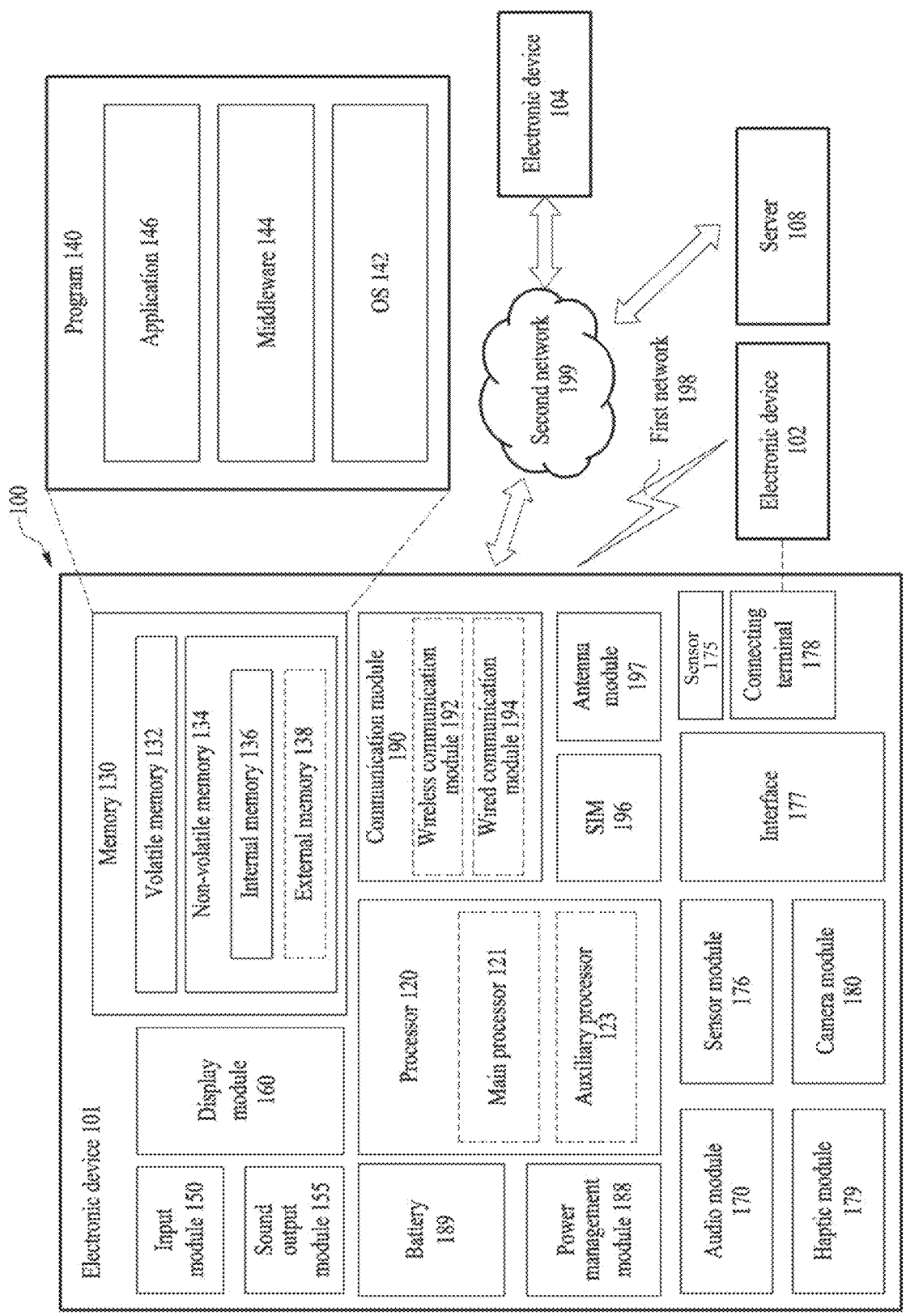
FIG. 1 is a block diagram of an electronic device in a network environment according to an embodiment.

Hereinafter, embodiments will be described in detail with reference to the accompanying drawings. Like reference numerals refer to like elements and a repeated description related thereto will be omitted.

FIG. 1 is a block diagram illustrating an electronic device in a network environment according to embodiments. Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to embodiments, the electronic device 101 may communicate with the electronic device 104 via the server 108. According to embodiments, the electronic device 101 may include a processor 120, a memory 130, an input module 150, a sound output module 155, a display module 160, an audio module 170, a sensor 175, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added in the electronic device 101. In some embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to embodiments, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to embodiments, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to embodiments, the auxiliary processor 123 (e.g., an ISP or a CP) may be implemented as a portion of another component (e.g., the camera module 180 or the communication module 190) that is functionally related to the auxiliary processor 123. According to embodiments, the auxiliary processor 123 (e.g., an NPU) may include a hardware structure specified for artificial intelligence (AI) model processing. An AI model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to embodiments, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to embodiments, the display device 160 may include a touch sensor adapted to sense a touch, or a pressure sensor adapted to measure an intensity of a force incurred by the touch.

The audio module 170 may convert a sound into an electric signal or vice versa. According to embodiments, the audio module 170 may obtain the sound via the input device 150 or output the sound via the sound output device 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to embodiments, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to embodiments, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to embodiments, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to embodiments, the haptic module 179 may include, for example, a motor, a piezoelectric element, or an electric stimulator.

The camera module 180 may capture a still image and moving images. According to embodiments, the camera module 180 may include one or more lenses, image sensors, ISPs, or flashes.

The power management module 188 may manage power supplied to the electronic device 101. According to embodiments, the power management module 188 may be implemented as, for example, at least a part of a power management integrated circuit (PMIC).

The battery 189 may supply power to at least one component of the electronic device 101. According to embodiments, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to embodiments, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to embodiments, the antenna module 197 may include an antenna including a radiating element including a conductive material or a conductive pattern formed in or on a substrate (e.g., a printed circuit board (PCB)). According to embodiments, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to embodiments, another component (e.g., a radio frequency integrated circuit (RFIC)) other than the radiating element may be additionally formed as a part of the antenna module 197.

According to embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to embodiments, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the result, with or without further processing the result, as at least part of a response to the request. To that end, cloud computing, distributed computing, mobile edge computing (MEC), or client-server computing technology may be used, for example. The electronic device 101 may provide ultra low-latency services using, e.g., distributed computing or mobile edge computing. In embodiments, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that various example embodiments of the present disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., by wire), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to embodiments, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the foldable electronic device 101). For example, a processor (e.g., the processor 120) of the machine (e.g., the foldable electronic device 101) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to embodiments, a method according to embodiments of the disclosure may be included and provided in a computer program product. The computer program product may be traded as a product between a seller and a buyer. The computer program product may be distributed in the form of a machine-readable storage medium (e.g., compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to embodiments, each component (e.g., a module or a program) of the above-described components may include a single entity or multiple entities, and some of the multiple entities may be separately disposed in different components. According to embodiments, one or more of the above-described components may be omitted, or one or more other components may be added. Alternatively or additionally, a plurality of components (e.g., modules or programs) may be integrated into a single component. In such a case, according to embodiments, the integrated component may still perform one or more functions of each of the plurality of components in the same or similar manner as they are performed by a corresponding one of the plurality of components before the integration. According to embodiments, operations performed by the module, the program, or another component may be carried out sequentially, in parallel, repeatedly, or heuristically, or one or more of the operations may be executed in a different order or omitted, or one or more other operations may be added.

Figure 2A:
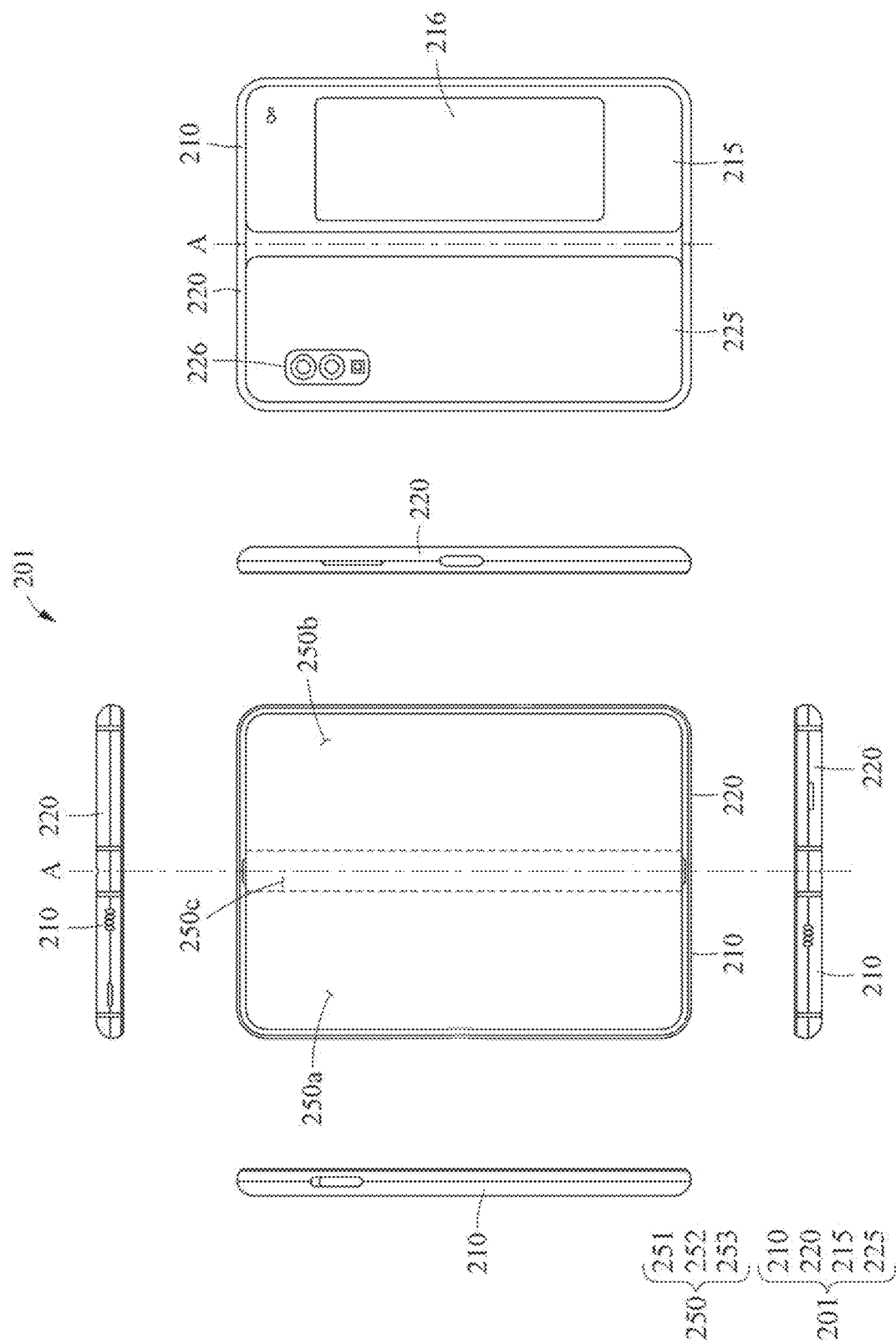
FIG. 2A is a view illustrating a first state of a foldable electronic device according to an embodiment.

In FIG. 2A and other following drawings, illustrated is a spatial coordinate system defined by an X-axis, a Y-axis, and a Z-axis that are orthogonal to each other. The X-axis may represent a width direction of an electronic device, the Y-axis may represent a length direction of the electronic device, and the Z-axis may represent a height (or thickness) direction of the electronic device.

Figure 2B:
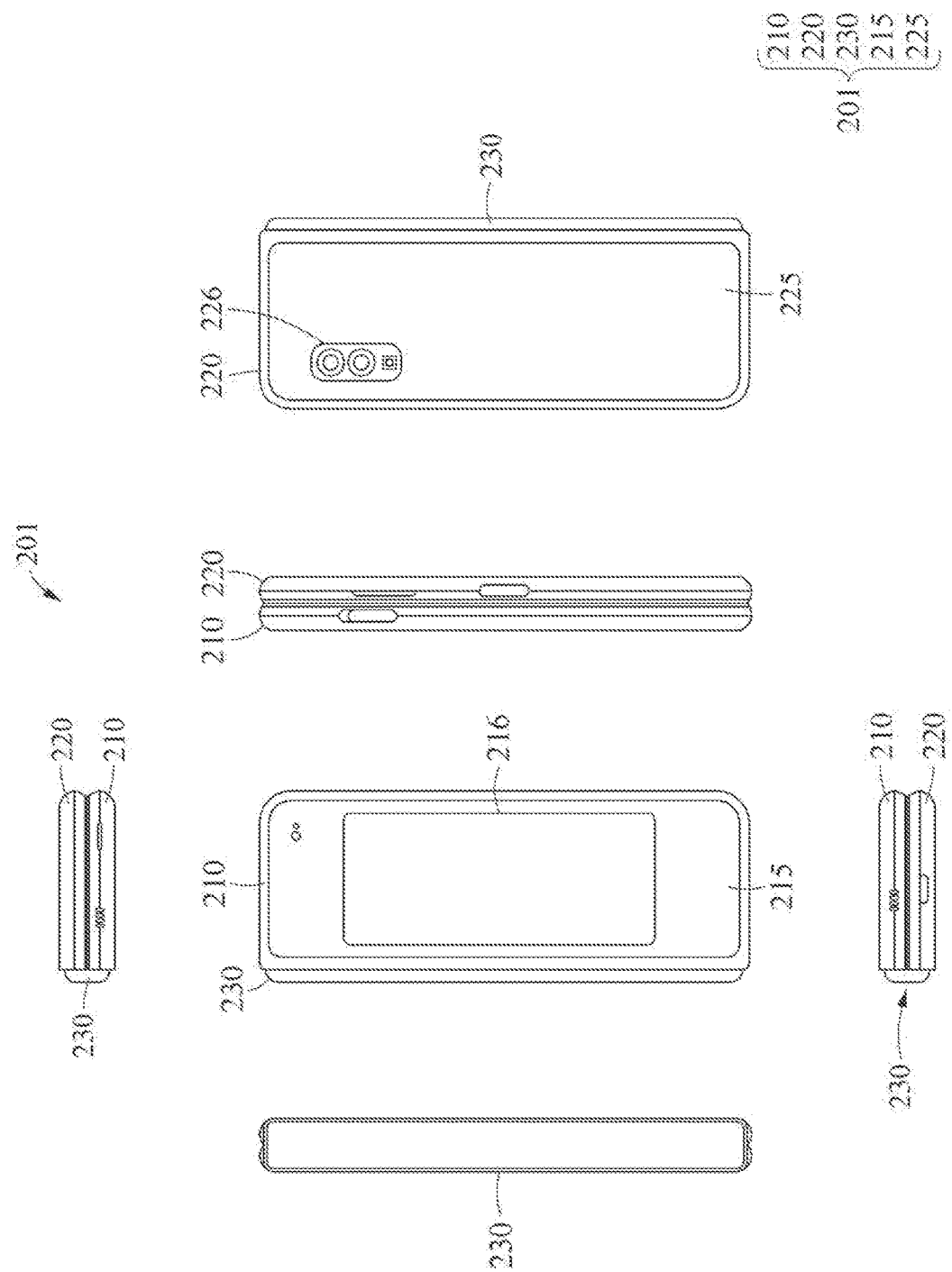
FIG. 2B is a view illustrating a second state of the foldable electronic device according to an embodiment.
Figure 2C:
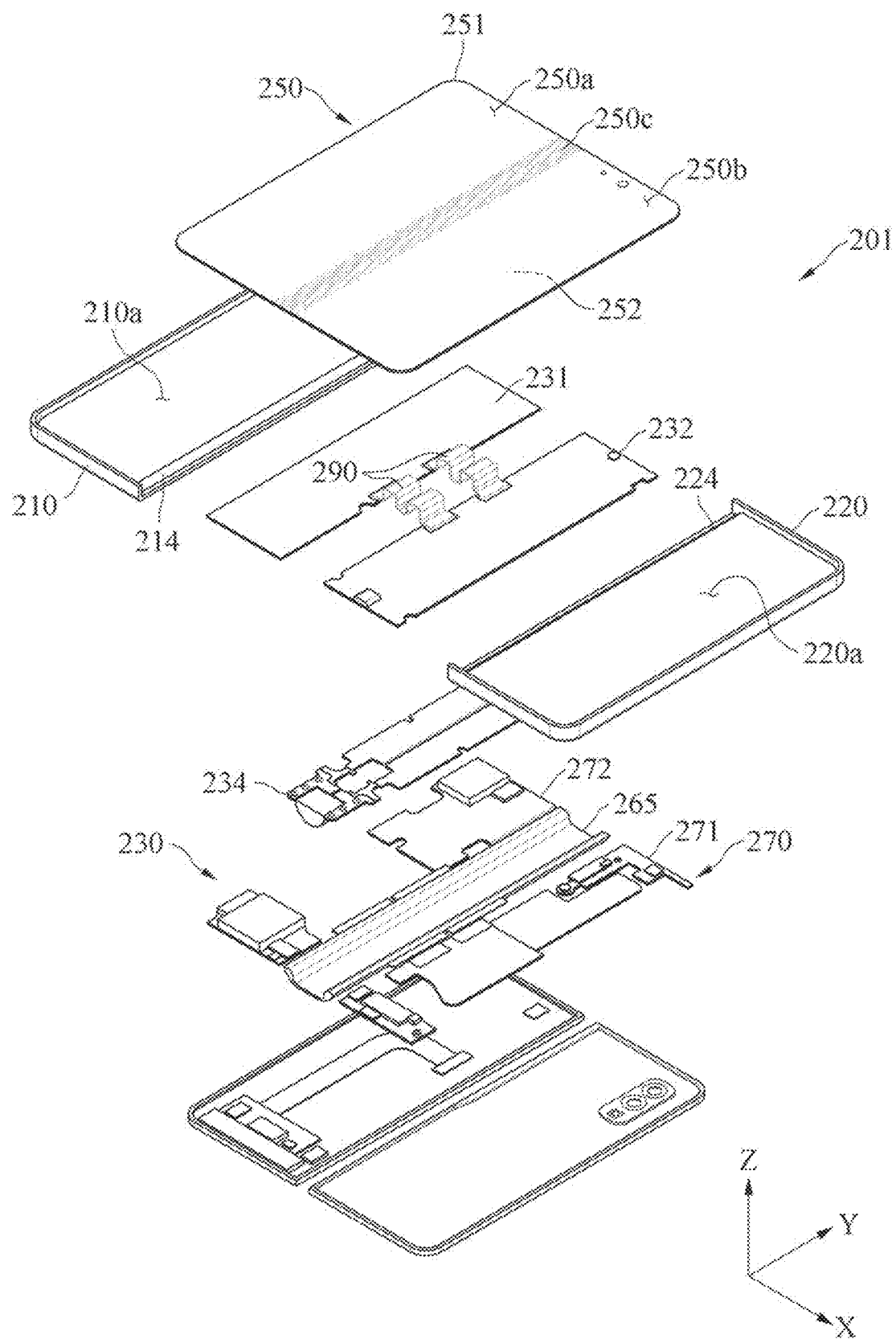
FIG. 2C is an exploded perspective view of the foldable electronic device according to an embodiment.

FIG. 2A is a view illustrating a first state of a foldable electronic device according to embodiments, FIG. 2B is a view illustrating a second state of the foldable electronic device according to embodiments, and FIG. 2C is an exploded perspective view of the foldable electronic device according to embodiments.

Referring to FIGS. 2A to 2C, in embodiments, a foldable electronic device (e.g., the electronic device 101 of FIG. 1) may include a pair of housings 210 and 220 and a display 250 (e.g., the display module 160 of FIG. 1) arranged in a space formed by the pair of housings 210 and 220. In embodiments, a surface (or a surface on which the display 250 is visually visible from the outside), in which the display 250 is arranged, of the foldable electronic device 201 may be defined as the front surface of the foldable electronic device 201 and a surface opposite to the front surface thereof may be defined as the rear surface of the foldable electronic device 201. A surface surrounding a space between the front surface and the rear surface thereof may be defined as a side surface of the foldable electronic device 201.

In embodiments, a foldable electronic device (e.g., the electronic device 101 of FIG. 1) may include a first housing 210, a second housing 220, a first rear cover 215, a second rear cover 225, a hinge structure 230, a display 250, PCBs 270, and a flexible PCB (FPCB) 290. The foldable electronic device 201 is not limited to the shape and combination relationship illustrated in FIGS. 2A and 2B, and may have a component combination relationship in a different structure.

In embodiments, the first housing 210 and the second housing 220 may be arranged on both sides of a folding axis A and may be substantially symmetrical to the folding axis A. In embodiments, an angle or a distance mutually formed by the first housing 210 and the second housing 220 may vary depending on a state of the foldable electronic device 201. For example, depending on whether the foldable electronic device 201 is in a first state (e.g., an unfolded state) as illustrated in FIG. 2A, a second state (e.g., a folded state) as illustrated in FIG. 2B, or an intermediate state between the first state and the second state, a distance or an angle mutually formed by the first housing 210 and the second housing 220 may vary.

In embodiments, the first housing 210 may include a first surface facing the front surface of the foldable electronic device 201, a second surface opposite to the first surface, and a first side portion enclosing at least a portion of a space between the first surface and the second surface. The second housing 220 may include a third surface facing the front surface of the foldable electronic device 201, a fourth surface opposite to the third surface, and a second side portion enclosing at least a portion of a space between the third surface and the fourth surface. The first surface and the third surface may face each other when the foldable electronic device 201 is in the folded state as illustrated in FIG. 2B.

In embodiments, the first housing 210 and the second housing 220 may form a recess of which a front surface is open to accommodate the display 250. In embodiments, at least a portion of the first housing 210 and the second housing 220 may be formed of a metal material or a non-metal material having appropriate rigidity to support the display 250. In embodiments, at least a portion of the first housing 210 and the second housing 220 formed of a metal material may provide a ground plane of the foldable electronic device 201 and may be electrically connected to a ground line formed on the PCB 270 arranged inside the foldable electronic device 201.

In embodiments, the foldable electronic device 201 may include at least one component to perform various functions, wherein the component is exposed at the front surface of the foldable electronic device 201 through at least one opening formed in the front surface of the foldable electronic device 201. For example, the component may include at least one of a front camera module, a receiver, a proximity sensor, an illuminance sensor, an iris recognition sensor, an ultrasonic sensor, and an indicator.

In embodiments, the first rear cover 215 and the second rear cover 225 may be arranged on the rear surface of the foldable electronic device 201. For example, the first rear cover 215 may be arranged on the second surface of the first housing 210 and the second rear cover 225 may be arranged on the fourth surface of the second housing 220. At least a portion of an edge of the first rear cover 215 may be enclosed by the first housing 210 and at least a portion of an edge of the second rear cover 225 may be enclosed by the second housing 220.

In embodiments, the first rear cover 215 and the second rear cover 225 may have substantially symmetrical shapes based on the folding axis A. In embodiments, the first rear cover 215 and the second rear cover 225 may have different shapes. In embodiments, the first housing 210 and the first rear cover 215 may be integrally formed as one and the second housing 220 and the second rear cover 225 may be integrally formed as one.

In embodiments, the first housing 210, the second housing 220, the first rear cover 215, and the second rear cover 225 may provide a space in which various components (e.g., a PCB, the antenna module 197 of FIG. 1, the sensor module 176 of FIG. 1, or the battery 189 of FIG. 1) of the foldable electronic device 201 may be arranged through a structure in which the first housing 210, the second housing 220, the first rear cover 215, and the second rear cover 225 are coupled to one another. In embodiments, at least one component may be visually exposed on the rear surface of the foldable electronic device 201. For example, at least a portion of a sub-display may be visually exposed through a first rear area 216 of the first rear cover 215. In embodiments, at least one component may be visually exposed through a second rear area 226 of the second rear cover 225. In this case, the component may include a proximity sensor, a rear camera module, and/or a flash.

In embodiments, the display 250 may be arranged in a space formed by a foldable electronic device 201. For example, the display 250 may be arranged in a recess formed by the pair of housings 210 and 220. The display 250 may be arranged to constitute most of the front surface of the foldable electronic device 201. The front surface of the foldable electronic device 201 may include an area in which the display 250 is arranged, a partial area (e.g., an edge area) of the first housing 210 adjacent to the display 250, and a partial area (e.g., an edge area) of the second housing 220. The rear surface of the foldable electronic device 201 may include the first rear cover 215, a partial area (e.g., an edge area) of the first housing 210 adjacent to the first rear cover 215, the second rear cover 225, and a partial area (e.g., an edge area) of the second housing 220 adjacent to the second rear cover 225. In embodiments, at least a partial area of the display 250 may be deformed into a planar or curved surface.

In embodiments, at least a partial area of the display 250 may be deformed. In embodiments, the display 250 may include a folding area 250c arranged along the folding axis A, a first area 250a arranged on a first side (e.g., the left side of the folding area 250c of FIG. 2A) based on the folding area 250c, and a second area 250b arranged on a second side (e.g., the right side of the folding area 250c of FIG. 2A) based on the folding area 250c. In embodiments, the first area 250a may be supported by the first housing 210 and the second area 250b may be supported by the second housing 220. However, the illustrated area division of the display 250 is an example, and the display 250 may be divided into a plurality of areas depending on the structure or functions of the display 250. For example, as illustrated in FIG. 2A, the display 250 may be divided into areas based on the folding area 250c extending in parallel to the folding axis A. In another example, the display 250 may be divided into areas based on another folding axis (e.g., a folding axis parallel with a width direction of an electronic device).

According to embodiments, the display 250 may be coupled to or disposed adjacent to a touch panel in which a touch sensing circuit and a pressure sensor configured to measure an intensity (or pressure) of a touch are provided. For example, the display 250 may be coupled to or disposed adjacent to a touch panel for detecting a stylus pen of an electromagnetic resonance (EMR) type, as an example of the touch panel.

According to embodiments, the first area 250a and the second area 250b may generally have symmetrical shapes with respect to the folding area 250c. In embodiments, a notch that is at least a partial cut to expose a sensor may be formed in at least one of the first area 250a and the second area 250b. For example, the first area 250a and the second area 250b may include portions having mutually symmetrical shapes and portions having mutually asymmetrical shapes.

In embodiments, the hinge structure 230 may be arranged between the first housing 210 and the second housing 220 and may include a hinge cover 265 to cover a space between the first housing 210 and the second housing 220. In embodiments, the hinge cover 265 may be visually exposed to the outside or occluded by the first housing 210 and the second housing 220, based on an operational state of the foldable electronic device 201 For example, when the foldable electronic device 201 is in the first state as illustrated in FIG. 2A, the hinge cover 265 may be occluded by the first housing 210 and the second housing 220 and not be exposed to the outside, and when the foldable electronic device 201 is in the second state as illustrated in FIG. 2B, the hinge cover 265 may be visually exposed to the outside between the first housing 210 and the second housing 220.

When the foldable electronic device 201 is in the intermediate state forming an angle between the first state of FIG. 2A and the second state of FIG. 2B, at least a portion of the hinge cover 265 may be exposed to the outside between the first housing 210 and the second housing 220 and in this case, an area of the hinge cover 265 exposed to the outside may be less than an exposed area of the hinge cover 265 in the second state (e.g., a folded state) of the foldable electronic device 201. In embodiments, the hinge cover 265 may include a curved shape.

In embodiments, when the foldable electronic device 201 is in the first state (e.g., the unfolded state of FIG. 2A), the first housing 210 and the second housing 220 may form a first angle (e.g., about 180 degrees) with each other and the first area 250a and the second area 250b of the display 250 may be oriented in substantially the same direction and may form substantially the same plane. In this case, the folding area 250c of the display 250 may be on substantially the same plane as the first area 250a and the second area 250b. In embodiments, when the foldable electronic device 201 is in the unfolded state, as the first housing 210 rotates at a second angle (e.g., about 360 degrees) relative to the second housing 220, the second surface and the fourth surface may be reversely folded to face each other.

In embodiments, when the foldable electronic device 201 is in the second state (e.g., the folded state of FIG. 2B), the first housing 210 and the second housing 220 may face each other. In this case, the first area 250a and the second area 250b of the display 250 may form a narrow angle (e.g., 0 to 10 degrees) therebetween and may face each other. In this case, at least a portion of the folding area 250c of the display 250 may be deformed into a curved surface.

In embodiments, when the foldable electronic device 201 is in an intermediate state between the first state and the second state (e.g., an intermediate open state), the first housing 210 and the second housing 220 may be arranged to form a predetermined angle. The surface of the first area 250a and the surface of the second area 250b of the display 250 may form an angle greater than that in the second state (e.g., a folded state) and less than that in the first state (e.g., a fully open state). At least a portion of the folding area 250c may include a curved surface and in this case, the curvature may be less than that in the second state (e.g., the folded state).

In embodiments, the display 250 may include a display panel 251 (e.g., a flexible display panel) and at least one plate 252 or a layer arranged on the rear surface of the display panel 251.

In embodiments, the display panel 251 may include a flexible display substrate, a plurality of display elements coupled to the display substrate to form pixels, one or more conductive lines coupled to the display substrate and electrically connected to other display elements, and a thin-film encapsulation layer configured to prevent inflow of external oxygen and moisture. The display panel 251 may include a touch panel, or the display panel 251 and a touch panel may be integrally formed therewith.

The display substrate may be formed of a flexible material, for example, a plastic material, such as polyimide (PI), but the material of the display substrate is not limited thereto and may include other flexible materials. The plurality of display elements may be arranged on the display substrate and form some pixels. For example, the plurality of display elements may be arranged in a matrix form on the display substrate to form pixels of the display panel 251. In this case, the plurality of display elements may include a fluorescent material or an organic fluorescent material that may express colors. For example, the display elements may include organic light-emitting diodes (OLEDs). The conductive lines may include one or more gate signal lines or one or more data signal lines. For example, the conductive lines may include a plurality of gate signal lines and a plurality of data signal lines, and the plurality of gate signal lines and the plurality of data signal lines may be arranged in a matrix form. In this case, the plurality of display elements may be arranged adjacent to a point where a plurality of lines intersect, and may be electrically connected to each line. The thin-film encapsulation layer may cover the display substrate, the plurality of display elements, and the conductive lines, thereby preventing inflow of external oxygen and moisture. In embodiments, the thin-film encapsulation layer may be formed by alternately stacking one or more organic film layers and one or more inorganic film layers.

In embodiments, a touch panel may be formed as an integral body with the display panel 251 or attached thereto. For example, the touch panel may be formed by patterning an aluminum metal mesh sensor on the thin-film encapsulation layer of the display panel 251.

In embodiments, a polarizing film may be stacked between the display panel 251 and the touch panel. The polarizing film may improve visibility of the display 250. The polarizing film may change the phase of light passing through the display 330. For example, the polarizing film may convert linearly polarized light into circularly polarized light or convert circularly polarized light into linearly polarized light, thereby preventing reflection of light incident to the display panel 251.

A window layer may be formed of a transparent plastic film having high flexibility and high hardness. For example, the window layer may be formed of a PI or polyethylene terephthalate (PET) film. In embodiments, the window layer may be formed as multiple layers including a plurality of plastic films.

In embodiments, the plate 252 may support the rear surface of the display panel 251, thereby improving the impact resistance of the display panel 251. In embodiments, the plate 252 may be divided into areas to support the rear surface of the first area 250a and the rear surface of the second area 250b of the display panel 251, respectively. In this case, the respective areas of the plate 252 may be separately attached to the rear surface of the first area 250a and the rear surface of the second area 250b of the display 250 so as not to contact each other along the folding axis A. According to this structure, the plate 252 may not interfere with the folding operation of the display 250 performed along the folding axis A.

In embodiments, the plate 252 may be formed of a conductive material, for example, copper or an alloy material including copper. In this case, the plate 252 may function as a heat transfer path that transfers heat generated by internal component (e.g., an AP) of the foldable electronic device 201 to the display panel 251 while improving the impact resistance of the display 250.

The hinge structure 230 may include a first support plate 231, a second support plate 232, a hinge housing 234 between the first support plate 231 and the second support plate 232, and an FPCB 290 arranged to traverse the first support plate 231 and the second support plate 232. In embodiments, the FPCB 290 may be flexible.

In embodiments, the first support plate 231 may be in a rear direction of the first area 250a of the display 250 and the second support plate 232 may be in a rear direction of the second area 250b of the display 250. In embodiments, the first support plate 231 may be connected to a first side (e.g., the −X direction of FIG. 2C) of the hinge housing 234 and the second support plate 232 may be connected to a second side (e.g., the +X direction of FIG. 2C) of the hinge housing 234. The first support plate 231 may be inserted into a first space 210a inside the first housing 210 and the second support plate 232 may be inserted into a second space 220a inside the second housing 220, and thus, the first housing 210 and the second housing 220 may be connected to the hinge structure 230.

In embodiments, the first housing 210 may include a first rotation support surface 214, and the second housing 220 may include a second rotation support surface 224 corresponding to the first rotation support surface 214. The first rotation support surface 214 and the second rotation support surface 224 may include curved surfaces corresponding to the curved surfaces included in the hinge cover 265.

In embodiments, when the foldable electronic device 201 is in an unfolded state (e.g., the foldable electronic device 201 of FIG. 2A), the first rotation support surface 214 and the second rotation support surface 224 may cover the hinge cover 265 such that the hinge cover 265 may not be exposed through the rear surface of the foldable electronic device 201 or may be minimally exposed. When the foldable electronic device 201 is in a folded state (e.g., the foldable electronic device 201 of FIG. 2B), the first rotation support surface 214 and the second rotation support surface 224 may rotate along the curved surfaces included in the hinge cover 265 such that the hinge cover 265 may be maximally exposed through the rear surface of the foldable electronic device 201.

In embodiments, the PCB 270 may include a first PCB 271 arranged on the side of the first support plate 231 and a second PCB 272 arranged on the side of the second support plate 232. The first PCB 271 and the second PCB 272 may be arranged inside a space formed by the hinge structure 230, the first housing 210, the second housing 220, the first rear cover 215, and the second rear cover 225. For example, the first PCB 271 may be arranged in the first space 210a inside the first housing 210 and the second PCB 272 may be arranged in the second space 220a inside the second housing 220. In this case, the first PCB 271 may be arranged between the first support plate 231 and the rear surface of the first housing 210 and the second PCB 272 may be arranged between the second support plate 232 and the rear surface of the second housing 220. Components for implementing various functions of the foldable electronic device 201 may be mounted on the first PCB 271 and the second PCB 272.

In embodiments, the FPCB 290 may include multiple portions, each of which connect components arranged inside the first housing 210 and the second housing 220. For example, the FPCB 290 may connect the first PCB 271 to the second PCB 272. The FPCB 290 may be connected to the hinge structure 230. At least a portion of the FPCB 290 may be arranged in a space formed by the hinge housing 234, and both ends of the FPCB 290 may extend to the first space 210a and the second space 220a by penetrating the first support plate 231 and the second support plate 232, respectively. In embodiments, the FPCB 290 may be arranged in a direction (e.g., the X-axis direction of FIG. 2C) perpendicular to the folding axis A of the foldable electronic device 201.

Figure 3A:
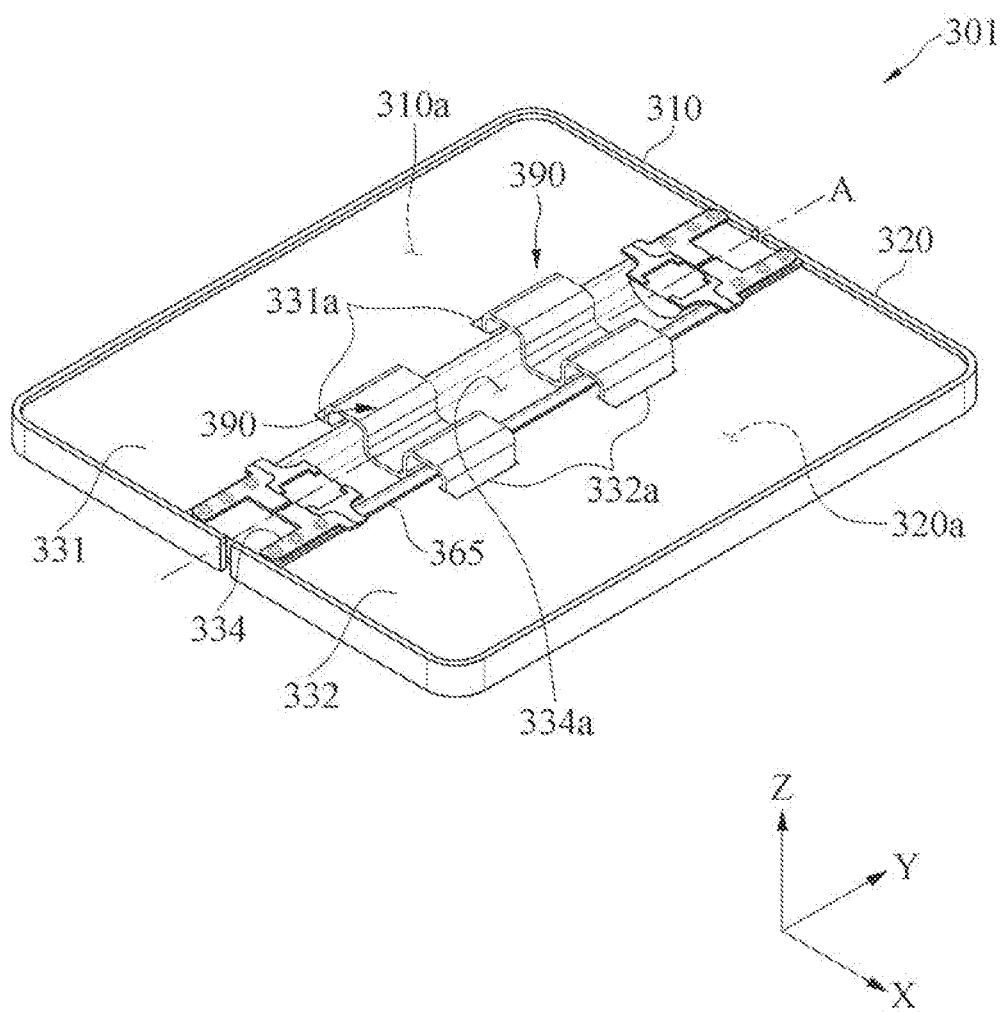
FIG. 3A is a view of some components of a foldable electronic device in a first state to describe a flexible printed circuit board (FPCB), according to an embodiment.
Figure 3B:
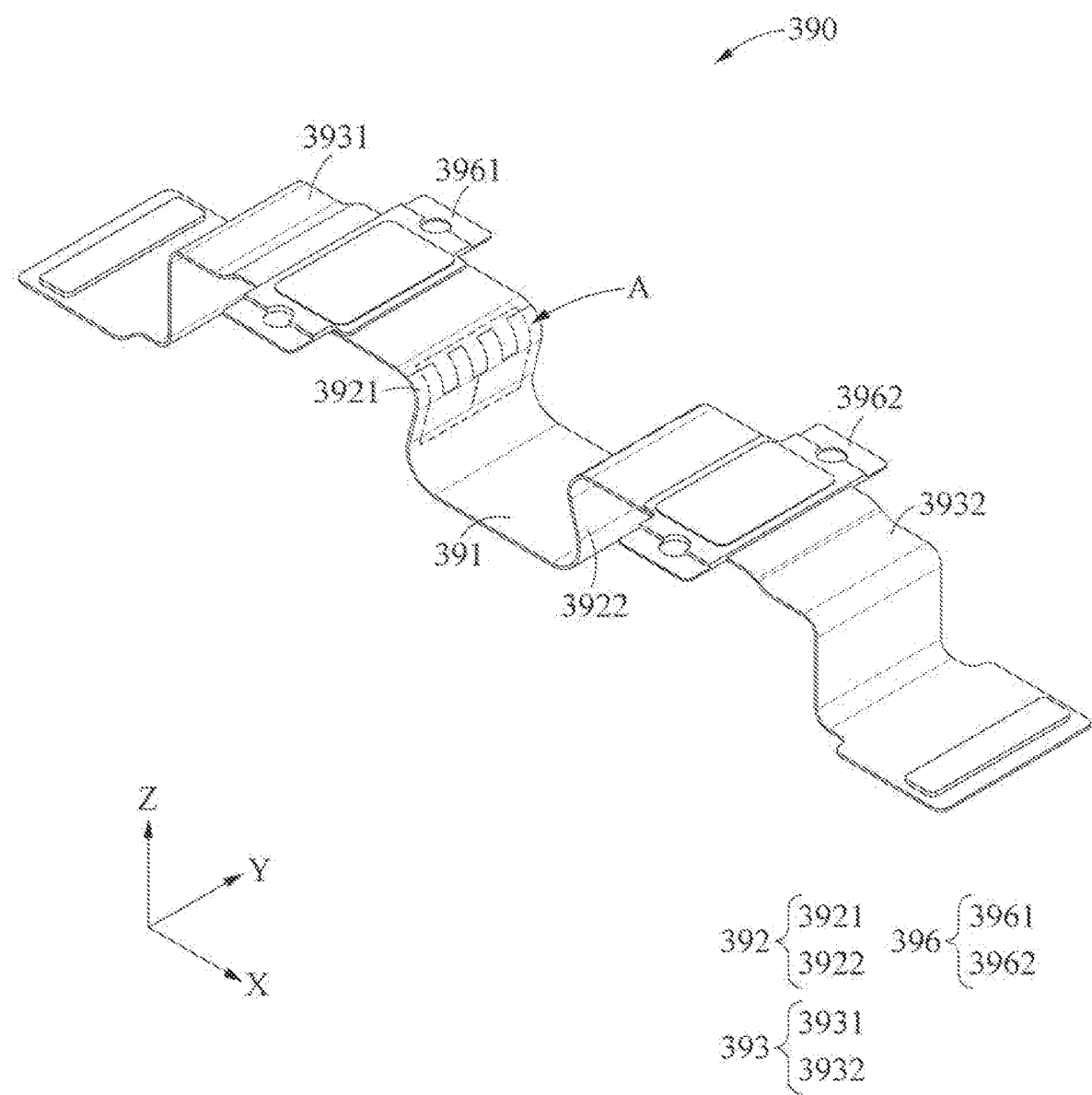
FIG. 3B is a perspective view of an FPCB according to an embodiment.
Figure 3C:
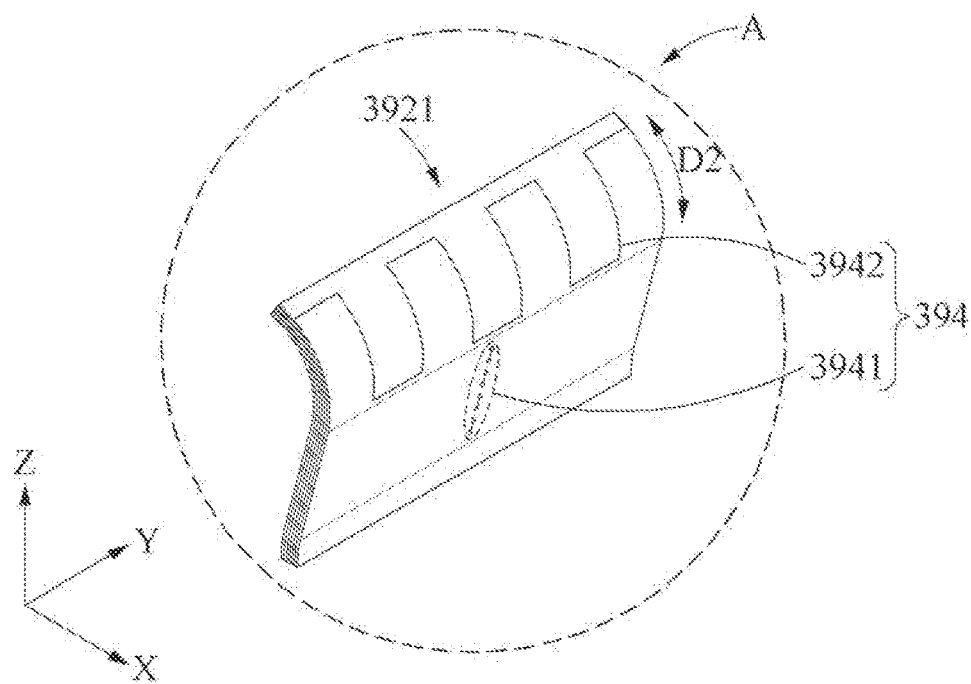
FIG. 3C is an enlarged cross-sectional perspective view of the FPCB in an A region of FIG. 3B.
Figure 3D:
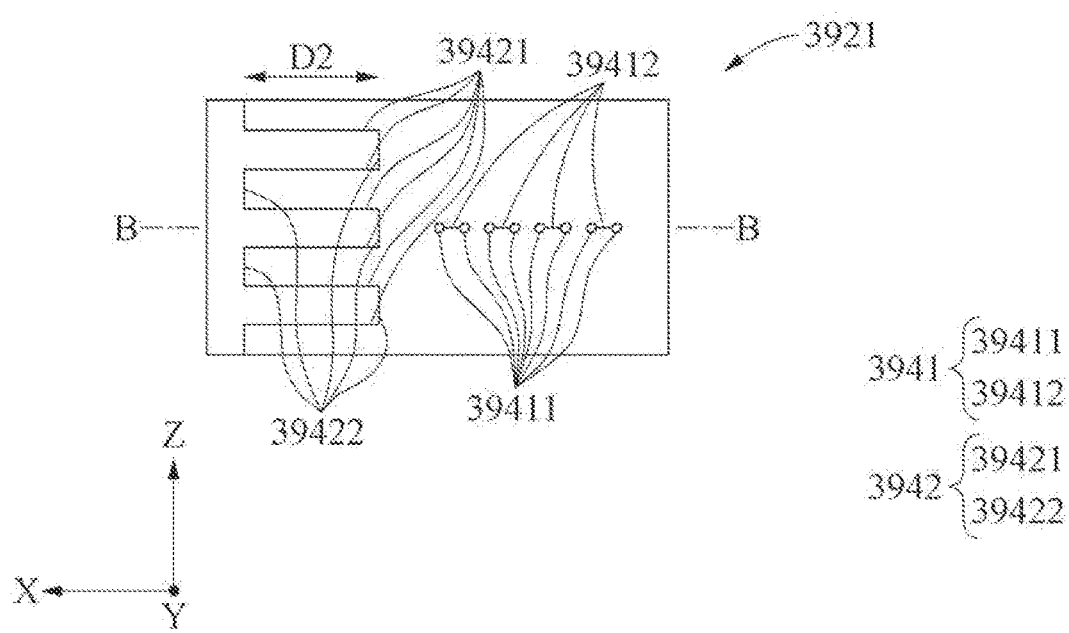
FIG. 3D is an enlarged plan view of the FPCB in an A region of FIG. 3C.
Figure 3E:
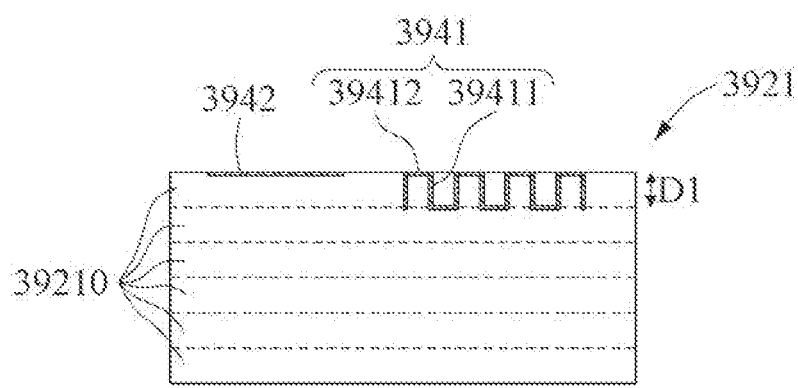
FIG. 3E is a cross-sectional view taken along line B-B of FIG. 3D.

FIG. 3A is a view of some components of a foldable electronic device in a first state to describe an FPCB, according to embodiments, FIG. 3B is a perspective view of an FPCB according to embodiments, FIG. 3C is an enlarged cross-sectional perspective view of the FPCB in an A region of FIG. 3B, FIG. 3D is an enlarged plan view of the FPCB in an A region of FIG. 3C, and FIG. 3E is a cross-sectional view taken along line B-B of FIG. 3D.

Referring to FIGS. 3A to 3E, a foldable electronic device (e.g., the electronic device 101 of FIG. 1 or the foldable electronic device 201 of FIG. 2A) in an embodiment may include a display (e.g., the display 250 of FIG. 2A), a first housing 310 forming a first space 310a, a second housing 320 forming a second space 320b, a hinge housing 334, a first support plate 331, a second support plate 332, and an FPCB 390.

In embodiments, the first support plate 331 and the second support plate 332 may be rotatably connected to the hinge housing 334 based on a folding axis A. For example, the first support plate 331 may connect the first housing 310 to the hinge housing 334, and the second support plate 332 may connect the second housing 320 to the hinge housing 334. In embodiments, at least a portion of the first support plate 331 may be arranged in the first space 310a and at least a portion of the second support plate 332 may be arranged in the second space 320a.

In embodiments, the first support plate 331 and the second support plate 332 may include openings 331a and 332a penetrating surfaces of the first support plate 331 and the second support plate 332, respectively. For example, the first support plate 331 may include at least one opening 331a penetrating the surface of the first support plate 331 and the second support plate 332 may include at least second opening 332a penetrating the surface of the second support plate 332.

In embodiments, the FPCB 390 may include multiple portions, each of which electrically connect components arranged in the first space 310a and the second space 320b, for example, a first PCB (e.g., the first PCB 271 of FIG. 2C) to a second PCB (e.g., the second PCB 272 of FIG. 2C). In embodiments, the FPCB 390 may have a longitudinal direction extending from the first space 310a to the second space 320a while traversing the folding axis A. In embodiments, at least a portion of the FPCB 390 may be arranged in a hinge space 334a formed by the hinge housing 334 and both ends of the FPCB 390 may extend to the first space 310a and the second space 320b through the first opening 331a and the second opening 332a, respectively.

In embodiments, the FPCB 390 may include a central portion 391, a pair of bending portions 392, and a pair of extension portions 393. The pair of bending portions 293 may include a first bending portion 3921 and a second bending portion 3922. The pair of extension portions 393 may include a first extension portion 3931 and a second extension portion 3932.

In embodiments, at least a portion of the central portion 391 may be arranged in a hinge space 334a. In embodiments, the first bending portion 3921 may be connected to a first end (e.g., the −X direction of FIG. 3B) of the central portion 391 extending to the first space 310a, and the second bending portion 3922 may be connected to a second end (e.g., the +X direction of FIG. 3B) of the central portion 391 extending to the second space 320a. In embodiments, as a portion of the pair of bending portions 392 bends in response to a change of a folding angle of the foldable electronic device 301, the shape of the pair of bending portions 392 may change. In embodiments, the first extension portion 3931 may extend in a direction opposite to the central portion 391 from the first bending portion 3921, and the second extension portion 3932 may extend in a direction opposite to the central portion 391 from the second bending portion 3922. For example, the pair of extension portions 393 may extend to the first space 310a and the second space 320a, respectively. In embodiments, an extension portion 393 may include a fixing part 396 to be fixed to the foldable electronic device 301. For example, the first extension portion 3931 may include a first fixing part 3961 to be fixed to the first space 310a and the second extension portion 3932 may include a second fixing part 3962 to be fixed to the second space 320a. In embodiments, the first fixing part 3961 and the second fixing part 3962 may be, for example, fixed to the first support plate 331 and the second support plate 332 by a fixing member (e.g., a fastener). However, a method of fixing the fixing part 396 to the foldable electronic device 301 is not limited thereto.

In embodiments, as the bending portion 392 bends in response to a change in a folding angle, the overall shape of the FPCB 390 may change to conform to the shape of the foldable electronic device 301. In embodiments, the FPCB 390 may include at least one sensing pattern part 394 that is arranged in at least one of the bending portion 3921 and 3922 and generates an impedance change in response to a shape change of the bending portion 392. In embodiments, the sensing pattern part 394 may be formed in both the first bending portion 3921 and the second bending portion 3922, or may be formed in at least one of the first bending portion 3921 and the second bending portion 3922. In addition, a plurality of sensing pattern parts 394 may be formed on both sides of one of the first and second bending portions 3921 and 3922. Hereinafter, for ease of description, a description of the sensing pattern part 394 is provided based on an example in which the sensing pattern part 394 is formed in the first bending portion 3921.

In embodiments, the sensing pattern part 394 may include a first pattern 3941 formed in a first portion of the bending portion 392 and may include a second pattern 3942 formed in a second portion of the bending portion 392. Each of the first and second patterns 3941 and 3942 may form an electrical path through which an electrical signal passes. The first pattern 3941 and the second pattern 3942 may be connected to a signal line configured to transmit a signal in a longitudinal direction of the FPCB 390 and may form an electrical path passing through a pattern. In embodiments, based on one sensing pattern part 394 formed in the FPCB 390, with respect to a longitudinal direction (e.g., the X-axis of FIG. 3B) of the FPCB 390, the first portion in which the first pattern 3941 is arranged may be between the central portion 391 and the second portion in which the second pattern 3942 is arranged. For example, the first pattern 3941 may be adjacent to the central portion 391.

In embodiments, the sensing pattern part 394 may be formed on the outer surface portion of the FPCB 390. For example, when the FPCB 390 is formed in a structure in which a plurality of layers is stacked, the sensing pattern part 394 may be formed in a layer adjacent to the outer side of the FPCB 390 compared to wirings for signal transmission. However, the arrangement of the sensing pattern part 394 is not limited thereto. In embodiments, when the sensing pattern part 394 is adjacent to the outer surface portion of the FPCB 390, a degree of impedance changes of the sensing pattern part 394 may be easily detected through a sensor, such as the sensor 175 of FIG. 1, compared to a case in which the sensing pattern part 394 is arranged inside the FPCB 390. In embodiments, the first pattern 3941 may form a first path in which an electrical signal flows. The first pattern 3941 may be formed such that an electrical signal flowing in the first path moves in a first direction D1 in which a plurality of layers 39210 constituting the FPCB 390 is stacked. For example, the first direction D1 may be substantially perpendicular to the surface of the FPCB 390.

In embodiments, the first pattern 3941 may include a plurality of vertical conductive lines 39411 arranged in the first direction D1 and at least one horizontal conductive line 39412 connecting the plurality of vertical conductive lines to one another. In embodiments, the horizontal conductive line 39412 may be arranged in a direction parallel with the surface of the FPCB 390. The horizontal conductive line 39412 may connect a pair of adjacent vertical conductive lines 39411 to each other.

In embodiments, when the FPCB 390 is formed in a plurality of layer structures stacked in the first direction D1, at least some of the vertical conductive lines 39411 may be vias penetrating the layers. The horizontal conductive line 39412 may be formed in at least a portion of the plurality of layers 39210 to connect to the vertical conductive lines 39411.

In embodiments, the second pattern 3942 may form a second path in which an electrical signal flows. The second pattern 3942 may be formed such that an electrical signal flowing in the second path moves in parallel with the surface of the FPCB 390. In embodiments, the second pattern 3942 may be formed in a layer forming the surface of the FPCB 390. For example, as illustrated in FIG. 3E, when the FPCB 390 is formed in a structure in which the plurality of layers 39210 is stacked, the second pattern 3942 may be arranged in at least one of a pair of outermost layers 39210 among the plurality of layers 39210. In embodiments, the second pattern 3942 may include a plurality of first conductive lines 39421 spaced apart from each other and aligned in a second direction D2 parallel with the surface of a FPCB 390, and at least one second conductive line 39422 connecting a pair of first conductive lines 39421 adjacent to each other among the plurality of first conductive lines 39421. In embodiments, the second direction D2 in which the first conductive line 39421 is formed may be substantially perpendicular to the folding axis A. However, the second direction D2 in which the first conductive line 39421 is formed may be parallel with the folding axis A.

In embodiments, the first pattern 3941 may form the first electrical path flowing in the first direction D1 perpendicular to the surface of the FPCB and the second pattern 3942 may form the second electrical path flowing in the second direction D2 parallel with the surface of the FPCB. In embodiments, as a relative distance and an angle change in response to a shape change of the bending portion 392 based on a change in folding angles, the first pattern 3941 and the second pattern 3942 may cause a change in impedance occurring due to a mutual impact of electrical signals flowing therein, respectively. In embodiments, the change in impedance occurring between the first pattern 3941 and the second pattern 3942 of the sensing pattern part 394 may correspond to a change in folding angles of the foldable electronic device 301, and thus, a folding angle of the foldable electronic device 301 may be indicated by an impedance in the sensing pattern part 394. A change in the folding angle of the foldable electric device 301 may be indicated by a change in impedance in the sensing pattern part 394. A description thereof is provided later.

FIGS. 4A to 4E are views illustrating various examples of a first pattern part according to embodiments, and FIGS. 5A to 5F are views illustrating various examples of a second pattern part according to embodiments.

Referring to FIGS. 4A to 4E, in embodiments, first pattern parts 4941a, 4941b, 4941c, 4941d, and 4941e may form various electrical paths for an electrical signal to flow in a first direction D1.

Figure 4A:
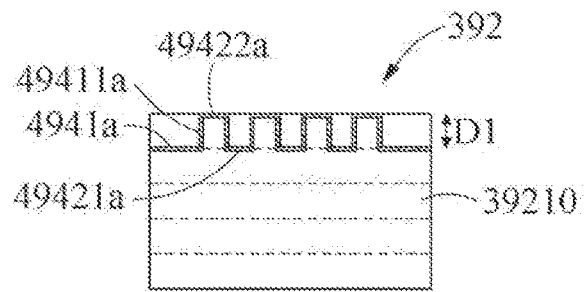
FIGS. 4A, 4B, 4C, 4D and 4E are views illustrating examples of a first pattern part according to an embodiment.
Figure 4B:
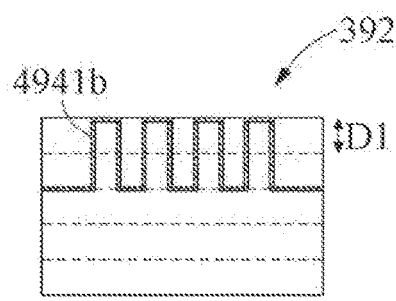
Figure 4C:
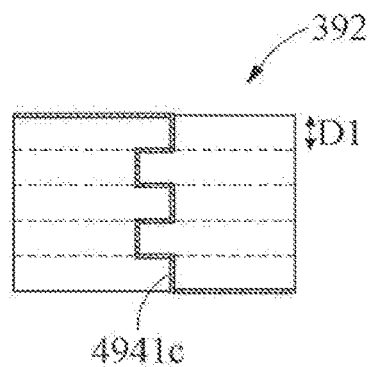
Figure 4D:
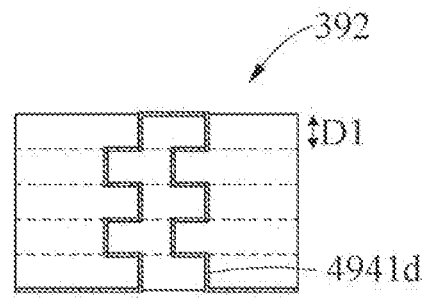
Figure 4E:
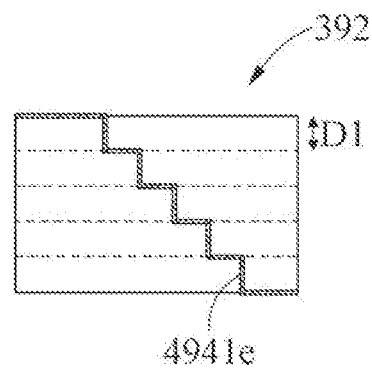

The first pattern part 4941a may include a plurality of vertical conductive lines 49411a spaced apart from each other and penetrating a layer forming the surface of the plurality of layers 39210 and a plurality of horizontal conductive lines 49421a and 49222a respectively connecting vertical conductive lines 49411a adjacent to each other among the plurality of vertical conductive lines 49411a. In this case, the plurality of horizontal conductive lines 49421a may not be exposed to the outside. In embodiments, referring to FIG. 4B, the first pattern part 4941b may increase a movement length of an electrical signal in the first direction D1 by consecutively penetrating a plurality of layers in the first direction D1. In embodiments, as illustrated in FIG. 4C, the first pattern part 4941c may form an electrical path in a zigzag shape based on a cross-section by penetrating each layer in the first direction D1. In embodiments, referring to FIG. 4D, the first pattern part 4941d may also form an electrical path in a shape of a round trip along a cross-section of the bending portion 392 in the first direction D1. In embodiments, referring to FIG. 4E, the first pattern part 4941e may form an electrical path in a shape in which a cross-section of the bending portion 392 is penetrated in the form of stairs in the first direction D1.

Referring to FIGS. 5A to 5E, in embodiments, second pattern parts 5942a, 5942b, 5942c, 5942d, 5942e, and 5942f may be formed in a shape in which an electrical signal flows along an electrical path parallel with the surface of the bending portion 392.

Figure 5A:
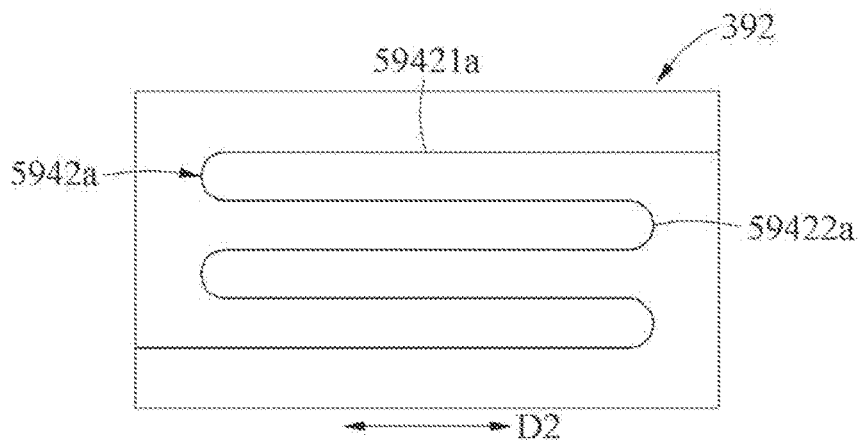
FIGS. 5A, 5B, 5C, 5D, 5E and 5F are views illustrating examples of a second pattern part according to an embodiment.
Figure 5B:
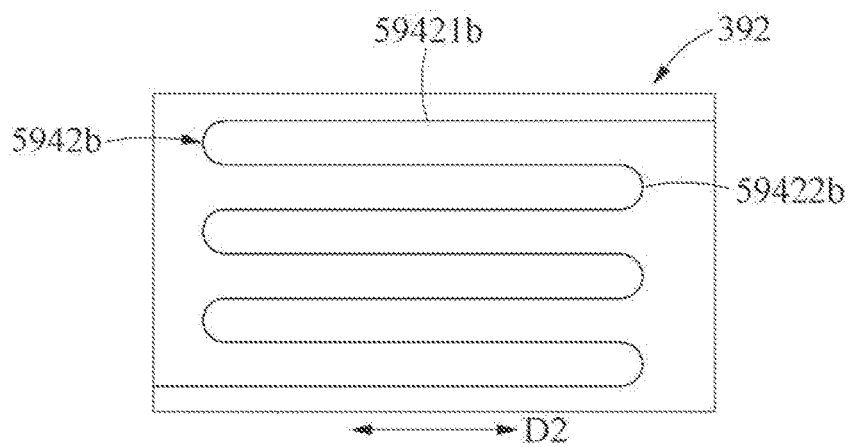
Figure 5C:
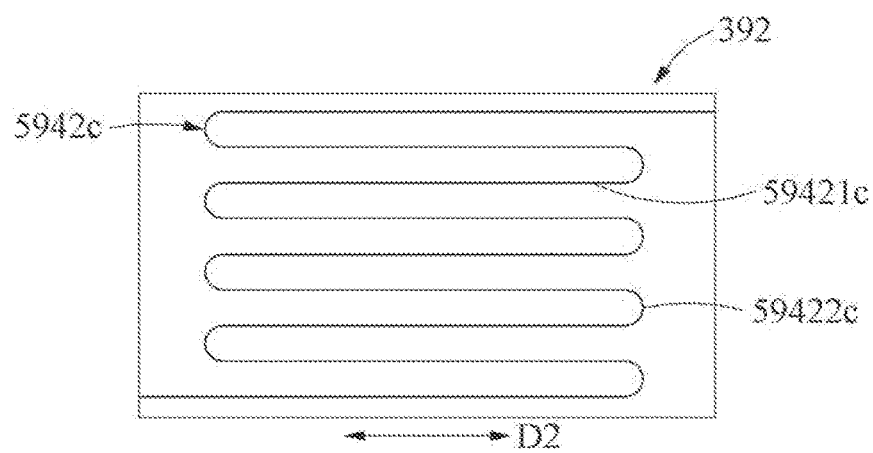

Referring to FIGS. 5A, 5B, and 5C, the second pattern parts 5942a, 5942b, and 5942c may include a plurality of first conductive lines 59421a, 59421b, and 59421c spaced apart from each other and having longitudinal directions parallel with the second direction D2, and a plurality of second conductive lines 59422a, 59422b, and 59422c connecting ends of adjacent first conductive lines 59421a, 59421b, and 59421c. In embodiments, the plurality of second conductive lines 59422a, 59422b, and 59422c may be shorter than the first conductive lines 59421a, 59421b, and 59421c. In embodiments, the plurality of second conductive lines 59422a, 59422b, and 59422c may form a smooth curved line and may connect the first conductive lines 59421a, 59421b, and 59421c. In embodiments, as intervals between the first conductive lines 59421a, 59421b, and 50421c are adjusted based on a design condition, the second pattern parts 5942a, 5942b, and 5942c may be formed such that the numbers of first conductive lines 59421a, 59421b, and 59421c arranged in the bending portion 392 vary. Based on the number and intervals of the first conductive lines 59421a, 59421b, and 59421c arranged in the bending portion 392, an impedance of an electrical signal flowing in the second pattern parts 5942a, 5942b, and 5942c may vary.

Figure 5D:
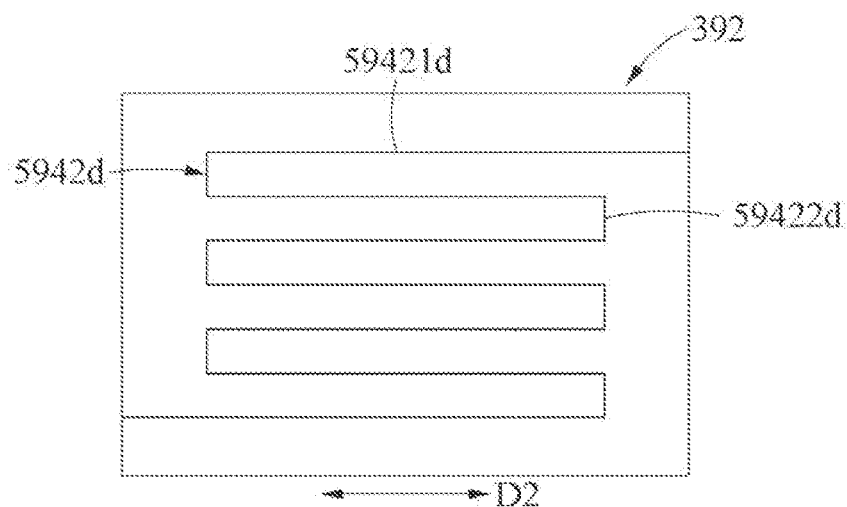
Figure 5E:
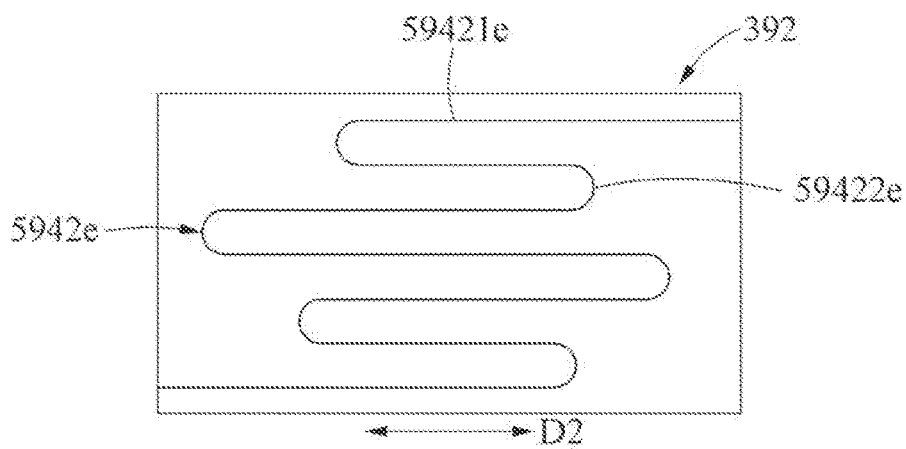

In embodiments, referring to FIG. 5D, the second pattern part 5942d may include a plurality of first conductive lines 59421d in parallel with the second direction D2 and a plurality of second conductive lines 59422d vertically connecting the plurality of first conductive lines 59421d to one another. In embodiments, referring to FIG. 5E, the second pattern part 5942e may include a plurality of first conductive lines 59421e having different lengths and parallel with the second direction D2 and a plurality of second conductive lines 59422e connecting the plurality of first conductive lines 59421e to one another.

Figure 5F:
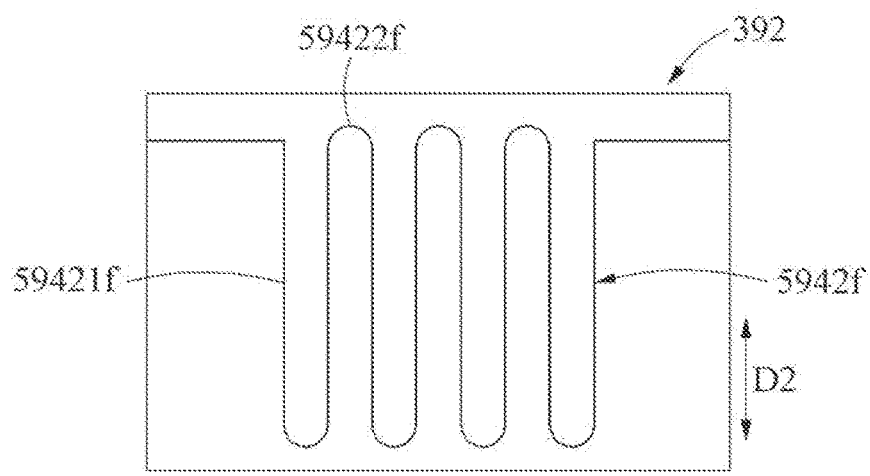

In embodiments, referring to FIG. 5F, the second pattern part 5942f may include a plurality of first conductive lines 59421f having a longitudinal direction and a plurality of second conductive lines 59422f connecting the first conductive lines 59421f to one another. In contrast to FIGS. 5A to 5E, the second direction D2 formed by the first conductive lines 59421*f* may be perpendicular to a longitudinal direction of an FPCB (e.g., the FPCB 390 of FIG. 3B). For example, the longitudinal direction of the first conductive line 59421*f* of FIG. 5F may be perpendicular to the longitudinal direction of the first conductive line 39421 of FIG. 3D. The second pattern part 5942*f* may be formed in various shapes to form an electrical path parallel with the surface of the bending portion 392.

Figure 6A:
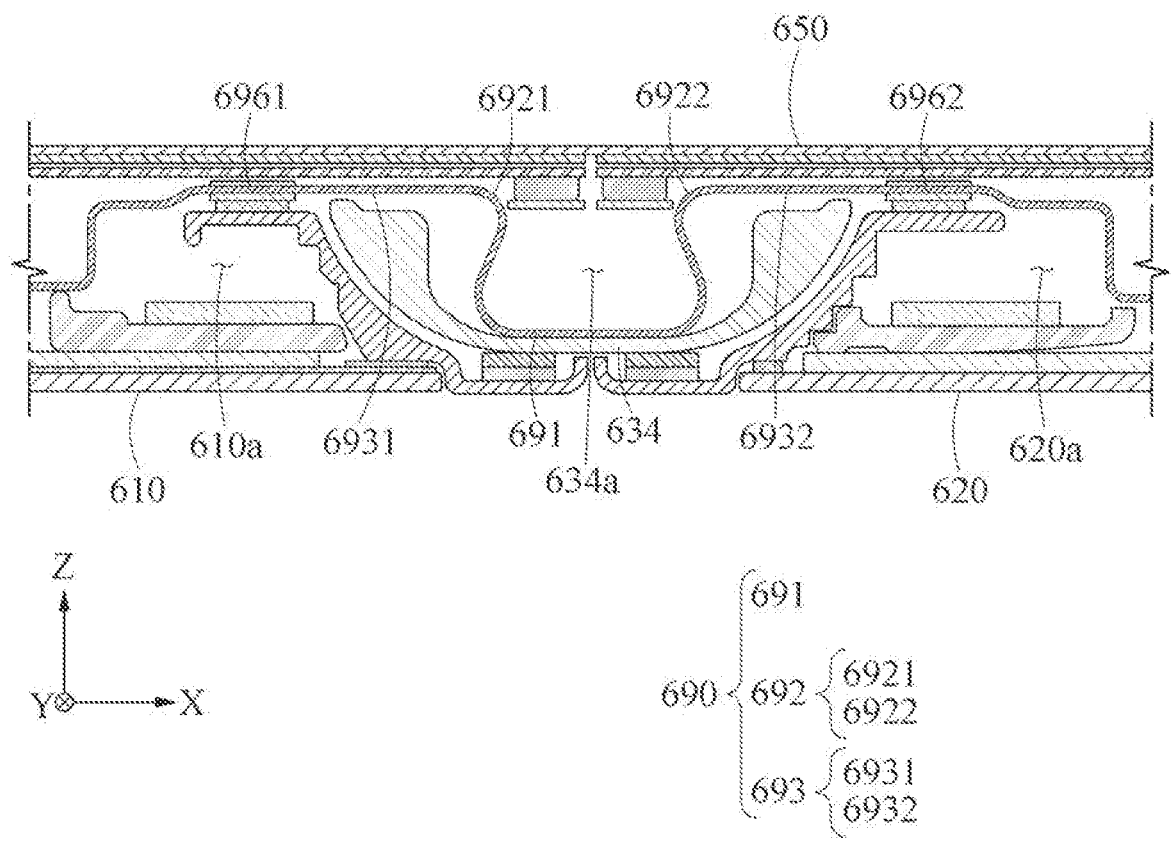
FIG. 6A is a cross-sectional view of an FPCB of a foldable electronic device in a first state according to an embodiment.
Figure 6B:
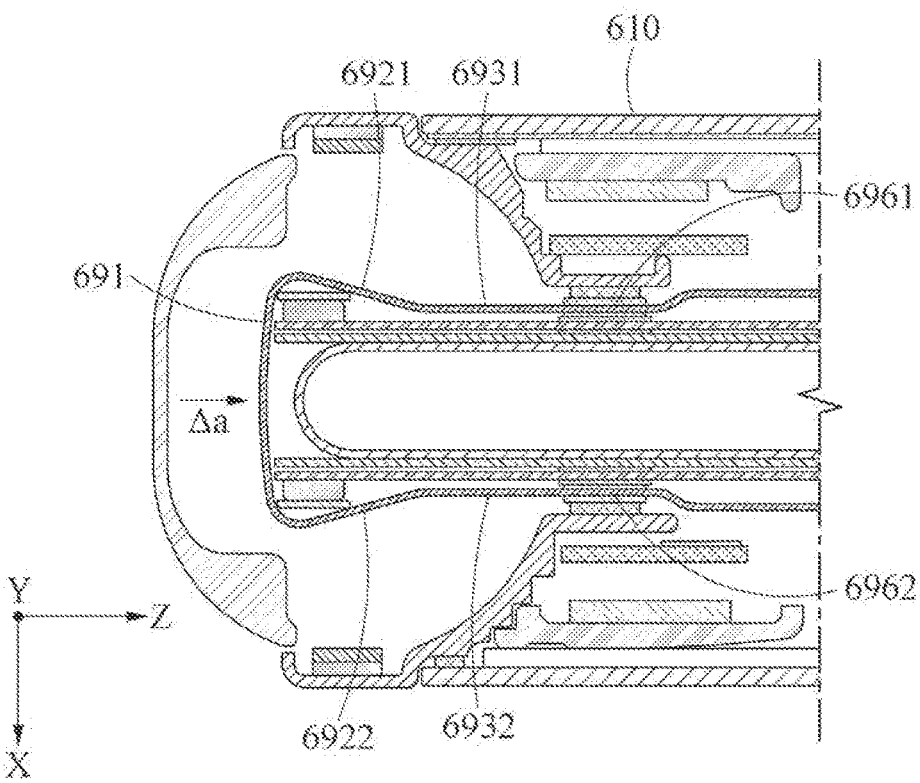
FIG. 6B is a cross-sectional view of the FPCB of the foldable electronic device in a second state according to an embodiment.
Figure 6C:
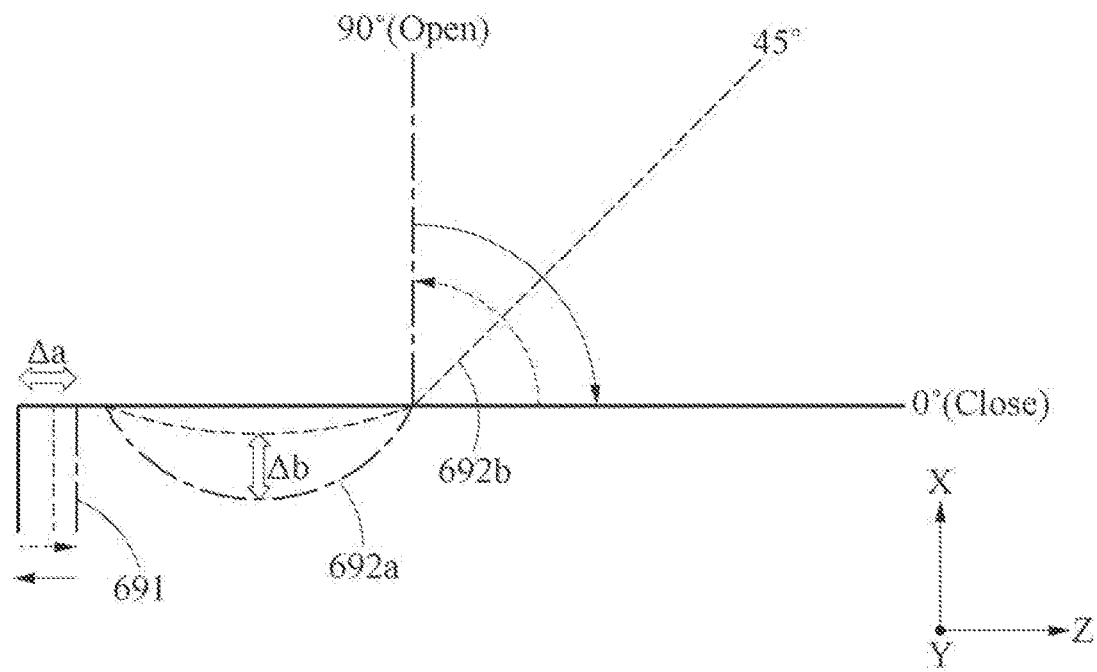
FIG. 6C is a schematic view of a shape change of an FPCB in response to a change in folding angle of the foldable electronic device according to an embodiment.

FIG. 6A is a cross-sectional view of an FPCB of a foldable electronic device in a first state according to embodiments, FIG. 6B is a cross-sectional view of the FPCB of the foldable electronic device in a second state according to embodiments, and FIG. 6C is a schematic view of a shape change of the FPCB in response to a change in folding angle of the foldable electronic device according to embodiments.

Referring to FIGS. 6A and 5B, a foldable electronic device (e.g., the electronic device 101 of FIG. 1, the foldable electronic device 201 of FIG. 2A, or the foldable electronic device 301 of FIG. 3A) in an embodiment may include a first housing 610, a second housing 620, a hinge housing 634, a display 650, an FPCB 690, a sensor, and a processor (e.g., the processor 120 of FIG. 1).

The first housing 610 and the second housing 620 may be foldably connected to the hinge housing 634 based on a folding axis (e.g., the folding axis A of FIG. 3A). The first housing 610 may form a first space 610*a* and the second housing 620 may form a second space 620*a*. A hinge may be arranged along the folding axis, and the hinge housing 634 may form a hinge space 634*a* therein.

In embodiments, the FPCB 690 may include a central portion 691 of which at least a portion is arranged in the hinge space 634*a*, a pair of bending portions 6921 and 6922 connected to both ends of the central portion 691, and a pair of extension portion 6931 and 6932 respectively extending from the bending portions 6921 and 6922 in directions opposite to the central portion 691. The first bending portion 6921 may be connected to a first end (e.g., an end in the −X direction of FIG. 6A) of the central portion 691 and may extend from the hinge space 634*a* to the first space 610*a*. The second bending portion 6922 may be connected to a second end (e.g., an end in the +X direction of FIG. 6B) of the central portion 691 and may extend from the hinge space 634*a* to the second space 620*a*. At least a portion of the first bending portion 6921 and the second bending portion 6922 may bend in response to a change in folding angles of the foldable electronic device. In embodiments, the first extension portion 6931 may extend from the first bending portion 6921 to the first space 610*a* and may be fixed to the first space 610*a* through a first fixing part 6961. The second extension portion 6932 may extend from the second bending portion 6922 to the second space 620*a* and may be fixed to the second space 620*a* through a second fixing part 6962. In embodiments, a sensing pattern part (e.g., the sensing pattern part 394 of FIG. 3B) may be formed in at least one of the bending portions 692.

In embodiments, because an arranged position of an extension portion 693 is fixed in the first or second housing 610 or 620 through the first or second fixing part 6961 or 6962, when the shape of the foldable electronic device 601 changes as illustrated in FIGS. 6A and 6B, positions or shapes of the central portion 691 and the bending portion 692 in the foldable electronic device 601 may change. For example, when the foldable electronic device 601 changes from a first state (e.g., an unfolded state) of FIG. 6A to a second state (e.g., a folded state) of FIG. 6B, a position of the central portion 691 may change in the +Z direction to move away from the bottom surface of the hinge space 634*a*. In this case, the first bending portion 6921 and the second bending portion 6922 may bend from the X-axis to the Z-axis and an angle related to the central portion 691 may change. In embodiments, as the shape of the bending portion 692 bends, relative positions and distances of the first pattern and the second pattern may change.

In embodiments, the sensor may detect an impedance of the sensing pattern part and the processor may be configured to recognize a folding angle of the foldable electronic device 601 based on a change of impedance of the sensing pattern part detected by the sensor.

In embodiments, because the sensor detects impedance of the sensing pattern part at a fixed position in the foldable electronic device 601, when the position and shape of the bending portion 692 changes in response to a change in folding angles of the foldable electronic device 601, impedance of the sensing pattern part detected by the sensor may change corresponding to the folding angle.

In embodiments, a first pattern (e.g., the first pattern 3941 of FIG. 3B) formed in the bending portion 692 may form an electrical path in a first direction (e.g., the first direction D1 of FIG. 3E) penetrating the surface of the bending portion 692, and a second pattern (e.g., the second pattern 3942 of FIG. 3E) may form an electrical path parallel with the surface of the bending portion 692. According to the structure described above, when a folding angle of the foldable electronic device 601 changes as illustrated in FIGS. 6A and 6B, the first pattern may cause an impedance change in the X-axis direction and the second pattern may cause an impedance change in the Z-axis direction. The sensor may detect an impedance change in response to a position change of the first pattern and the second pattern in the foldable electronic device 601. In embodiments, as the shape of the bending portion 692 bends, relative positions and distances of the first pattern and the second pattern may vary. In embodiments, the sensor may detect an impedance change of the sensing pattern part in response to a change in distance and angle between the first pattern and the second pattern.

In embodiments, the processor may recognize a folding angle of the foldable electronic device based on the impedance of the sensing pattern part detected by the sensor. The processor may recognize a folding angle change of the foldable electronic device based on the impedance change of the sensing pattern part detected by the sensor. For example, the processor may set data for an impedance value of the sensing pattern part and a corresponding folding angle of the foldable electronic device and may recognize a folding angle of the foldable electronic device by selecting a folding angle that matches an impedance value detected by the sensor from the set data. In embodiments, the processor may select an impedance value closest to a detected impedance value of the sensing pattern part from impedance values set to the data, and may recognize a folding angle of the foldable electronic device 601 as a folding angle that matches the closest impedance value.

In embodiments, the processor may operate to determine and/or perform an operating mode of the foldable electronic device 601 based on the recognized folding angle.

Referring to FIG. 6C, when the folding angle changes between the states of FIGS. 6A and 6B, a position of the central portion 691 of the FPCB 690 relative to the hinge housing 634 may change by Aa along the Z-axis. For example, when the folding angle changes from the second state (e.g., the folded state) of FIG. 5B to the first state (e.g., the folded state) of FIG. 5A, the central portion 691 may move by Aa in the +Z direction. In embodiments, a first portion 692a of the bending portion may move by Ab in the −X direction when the folding angle changes from the second state (e.g., the folded state) of FIG. 6B to the first state (e.g., the unfolded state) of FIG. 6A. In embodiments, an angle of a second portion 692b of the bending portion relative to the Z-axis may change from about 0 to about 90 degrees when the folding angle changes from the second state (e.g., the folded state) of FIG. 5B to the first state (e.g., the unfolded state) of FIG. 5A. In embodiments, when the first pattern is arranged in the first portion 691a and the second pattern is arranged in the second portion 692b, the sensor may detect an impedance change in response to a position change in a direction perpendicular to the surface of the central portion 691 through the first pattern and may detect an impedance change in response to a position change in a direction parallel with the surface of the central portion 691 through the second pattern. In embodiments, the sensor may detect an impedance change in response to a change of a relative angle formed by the first portion 692a and the second portion 692b through the first pattern and the second pattern.

In embodiments, the processor may calculate a bending angle of the bending portion based on information detected by the sensor. In embodiments, the processor may recognize a folding angle of the foldable electronic device 601 through a calculated angle of the bending portion. For example, the folding angle may be about twice the calculated bending angle of the bending portion. In the described example, it is provided that the processor recognizes a folding angle by detecting an impedance change based on a position and a degree of bending of the bending portion. However, this is only an example and embodiments are not limited thereto. The processor may indirectly recognize a folding angle in various methods based on an impedance change of the sensing pattern part arranged in the bending portion of the FPCB.

Figure 7A:
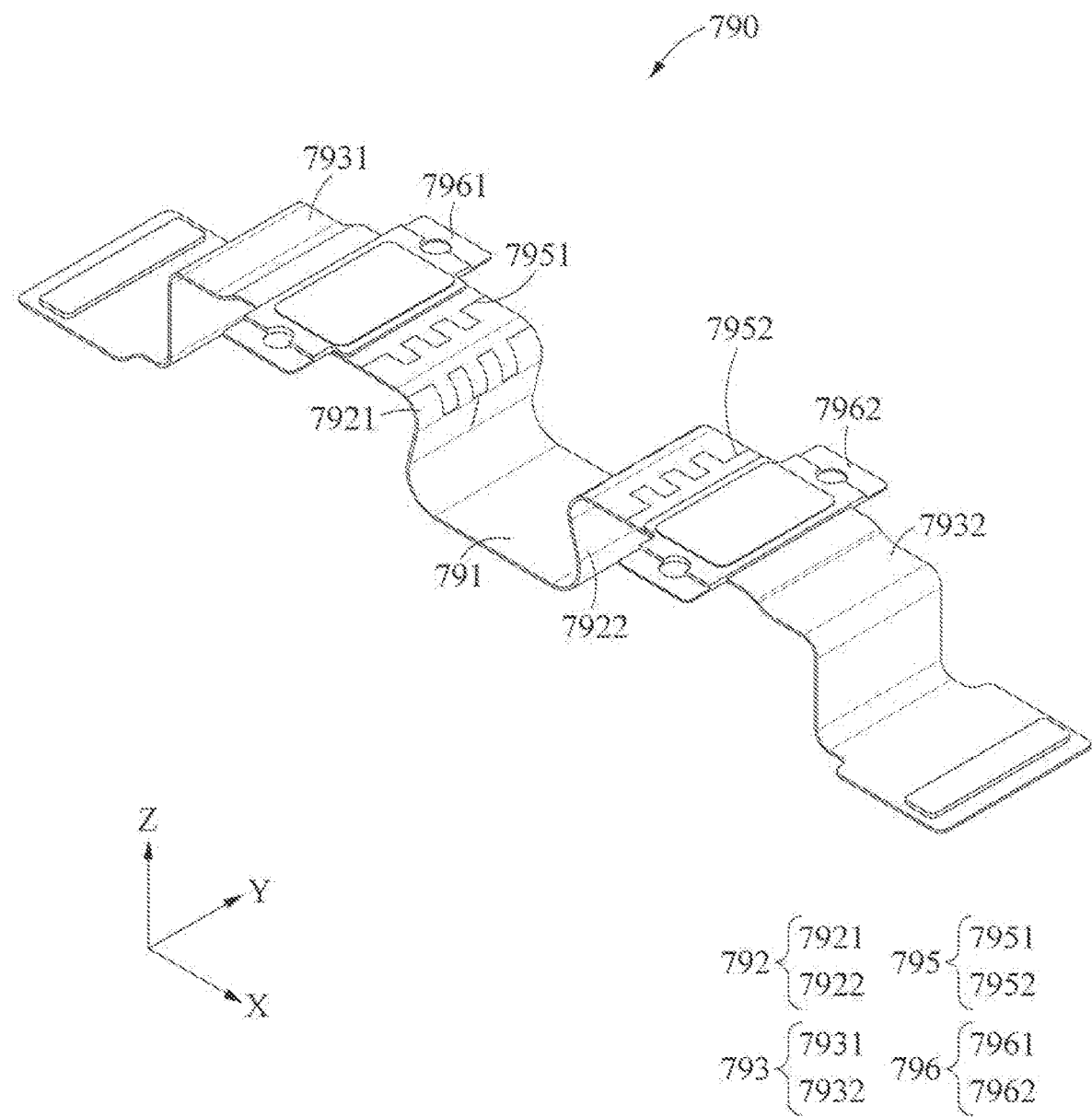
FIG. 7A is a perspective view of an FPCB according to an embodiment.
Figure 7B:
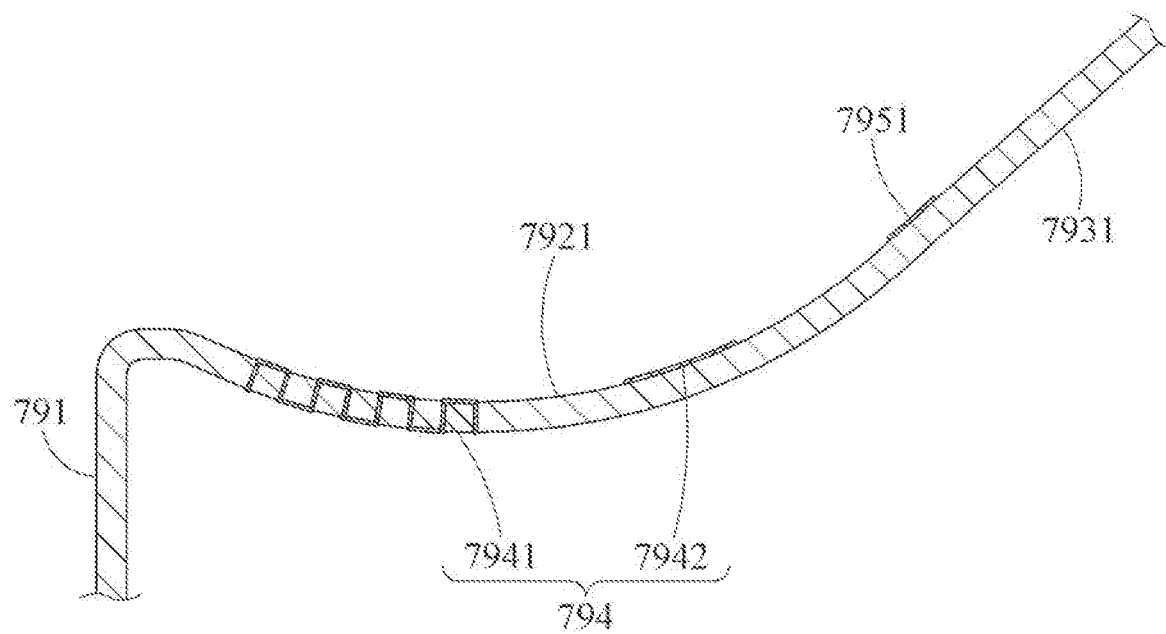
FIG. 7B is a schematic view of a shape change of the FPCB in response to a change in folding angle of a foldable electronic device according to an embodiment.

FIG. 7A is a perspective view of an FPCB according to embodiments, and FIG. 7B is a schematic view of a shape change of the FPCB in response to a change in folding angle of a foldable electronic device according to embodiments.

Referring to FIGS. 7A and 7B, an FPCB 790 in an embodiment may include a central portion 791, a first bending portion 7921 and a second bending portion 7922 respectively connected to both ends of the central portion 791 and at least partially bending. The FPCB 790 may also include a first extension portion 7931 and a second extension portion 7932 respectively extending from the first bending portion 7921 and the second bending portion 7922 away from the central portion 791. In embodiments, the first extension portion 7931 may include a first fixing part 7961 fixed to a first housing (e.g., the first housing 610 of FIG. 6A) and the second extension portion 7932 may include a second fixing part 7962 fixed to a second housing (e.g., the second housing 620 of FIG. 6B).

In embodiments, a sensing pattern part 794 may be formed in at least one bending portion 792. In embodiments, the sensing pattern part 794 may include a first pattern 7941 forming an electrical path including portions perpendicular to and parallel with the surface of the bending portion 792, and a second pattern 7942 forming an electrical path parallel with the surface of the bending portion 792. In embodiments, the sensing pattern part 794 may cause an impedance change in response to a shape change of the bending portion 792 based on a change in a folding angle. In embodiments, the sensing pattern part 794 may cause an impedance change in response to a temperature change of the FPCB 790. A sensor may detect an impedance change of the sensing pattern part 794 in response to a temperature change and a change in a folding angle.

In embodiments, a dummy pattern 795 may be formed in at least one of the pair of extension portions 793. For example, a first dummy pattern 7951 may be formed in the first extension portion 7931 and a second dummy pattern 7952 may be formed in the second extension portion 7932. In embodiments, the extension portion 793 may have a predetermined shape that remains constant throughout a change in folding angles. For example, the extension portion 793 may be fixed to a foldable electronic device (e.g., the foldable electronic device 501 of FIG. 5A) by a fixing part 796. In embodiments, the dummy pattern 795 may cause an impedance change in response to a temperature change of the FPCB 790 and not in response to a change in folding angles. The sensor may detect an impedance change of the dummy pattern 795 in response to a temperature change.

In embodiments, a processor (e.g., the processor 120 of FIG. 1) may correct information of an impedance change detected by the sensing pattern part 794 to information of an impedance change detected by the dummy pattern 795. For example, the processor may secure information of an impedance change that only depends on a folding angle in the information of an impedance change detected by the sensing pattern part 794 by subtracting the impedance change detected by the dummy pattern 795 from the impedance change detected by the sensing pattern part 794. In embodiments, the processor may operate to recognize a folding angle through the corrected information of the impedance change of the sensing pattern part 794.

Figure 8A:
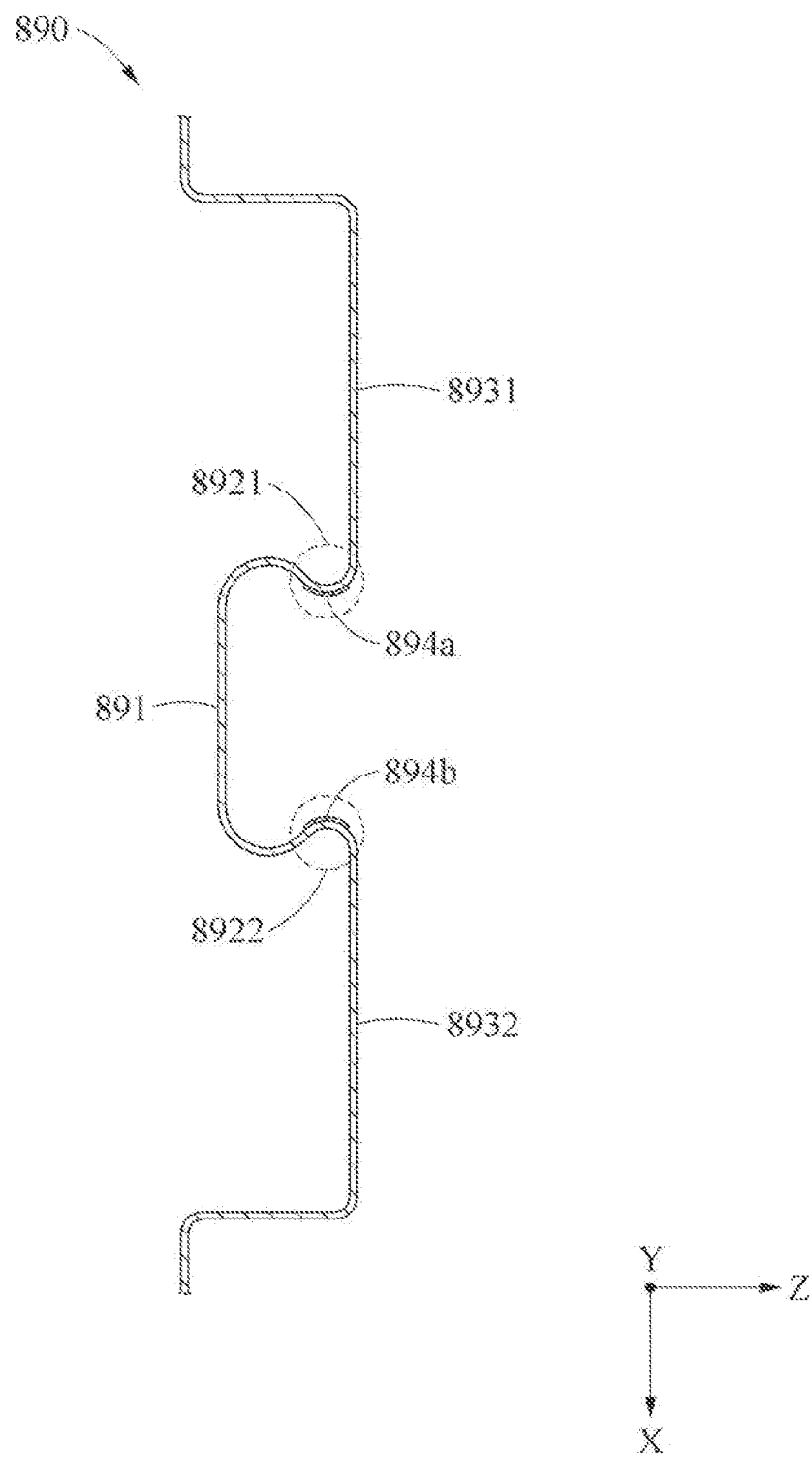
FIG. 8A is a view of an FPCB according to an embodiment.
Figure 8B:
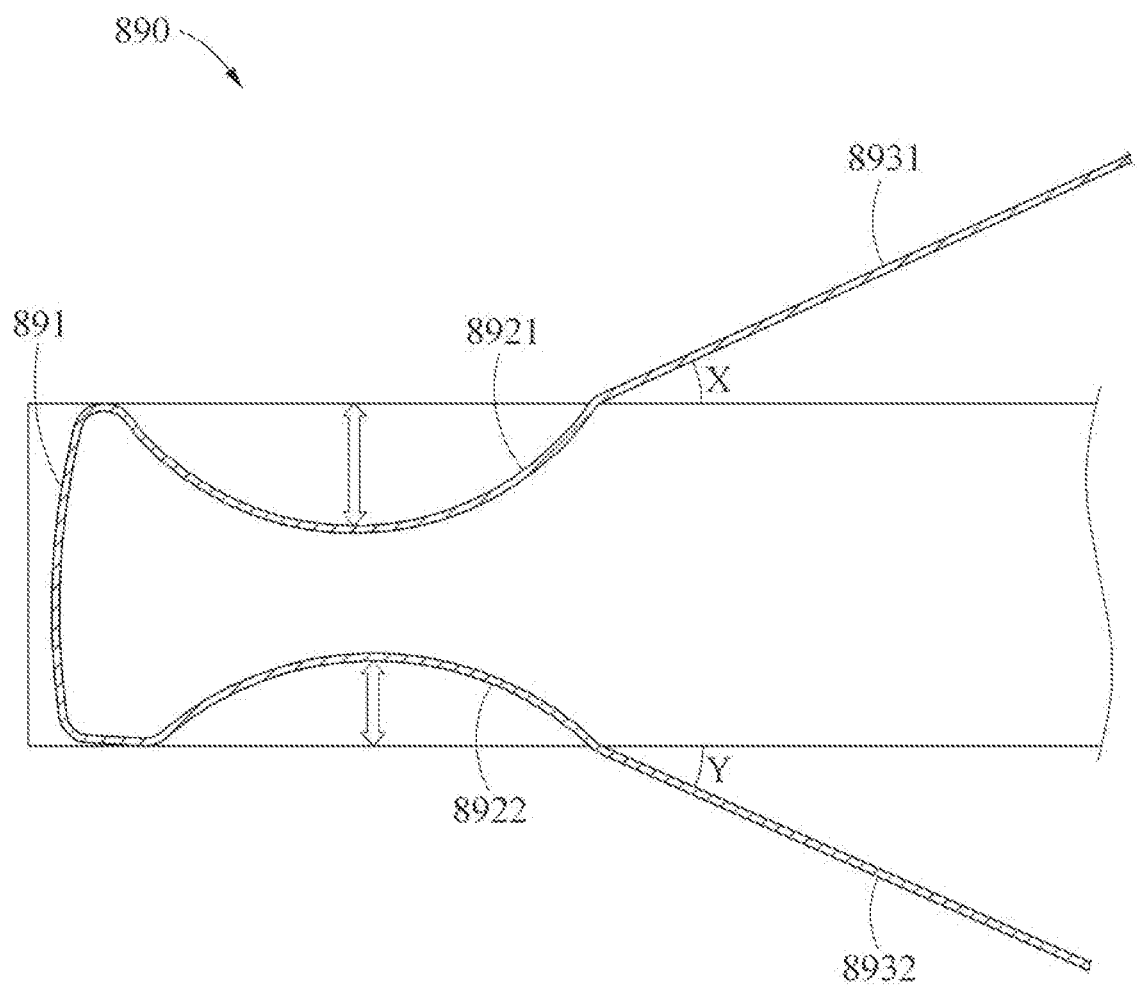
FIG. 8B is a schematic view of a shape change of the FPCB in response to a change in folding angle of a foldable electronic device according to an embodiment.

FIG. 8A is a view of an FPCB according to embodiments, and FIG. 8B is a schematic view of a shape change of the FPCB in response to a change in folding angle of a foldable electronic device according to embodiments.

Referring to FIGS. 8A and 8B, an FPCB 890 may include a central portion 891, a first bending portion 8921 connected to a first side (e.g., the −X direction) of the central portion and at least partially bending in response to a change in a folding angle, a second bending portion 8922 connected to a second side (e.g., the +X direction) of the central portion 891 and at least partially bending in response to a change in a folding angle, a first extension portion 8931 connected to the first bending portion 8921 opposite to the central portion 891, and a second extension portion 8932 connected to the second bending portion 8922 opposite to the central portion 891.

In embodiments, a first sensing pattern part 894a may be formed in the first bending portion 8921 and a second sensing pattern part 894b may be formed in the second bending portion 8922. In embodiments, the shapes of the first bending portion 8921 and the second bending portion 8922 may change in response to a change in folding angles and the first sensing pattern part 894a and the second sensing pattern part 894b may cause impedance changes in response to shape changes of the first and second bending portions 8921 and 8922, respectively.

In embodiments, a sensor may detect impedance changes of the first sensing pattern part 894a and the second sensing pattern part 894b. In embodiments, a processor (e.g., the processor 120 of FIG. 1) may recognize a folding angle based on information of impedance changes of the first sensing pattern part 894a and the second sensing pattern part 894b detected by the sensor. In embodiments, the processor may operate to calculate a first angle based on an impedance change of the first sensing pattern part 894a and a second angle based on an impedance change of the second sensing pattern part 894*b* and determine a folding angle of the foldable electronic device (e.g., the foldable electronic device 501 of FIG. 5A). The folding angle may be, for example, in a range between the first angle and the second angle. For example, the processor may recognize a mean value of the first angle and the second angle as a folding angle of the foldable electronic device. However, embodiments are not limited thereto.

According to the structure described above, as illustrated in FIG. 8B, even if an error occurs in impedance change values of the first and second sensing pattern parts 894*a* and 894*b* as the FPCB 890 tilts in one direction while the shape of the FPCB 890 changes, a folding angle of the foldable electronic device may be more accurately recognized by mutually compensating for a first folding angle and a second folding angle, which are detected through impedance changes of the first and second sensing pattern parts 894*a* and 894*b* arranged in the first and second bending portions 8921 and 8922, respectively.

Figure 9A:
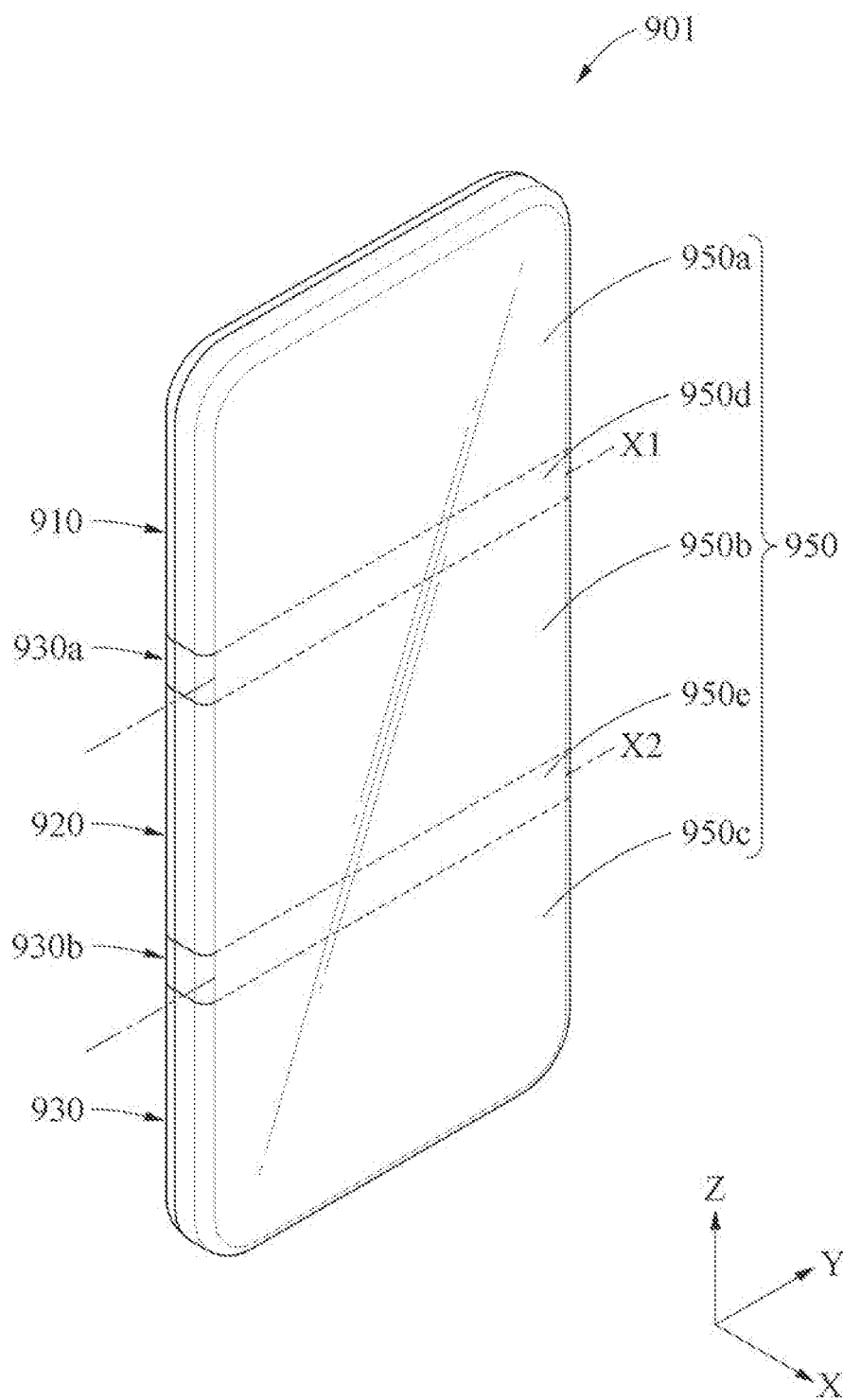
FIG. 9A is a view illustrating a first state of a foldable electronic device according to an embodiment.
Figure 9B:
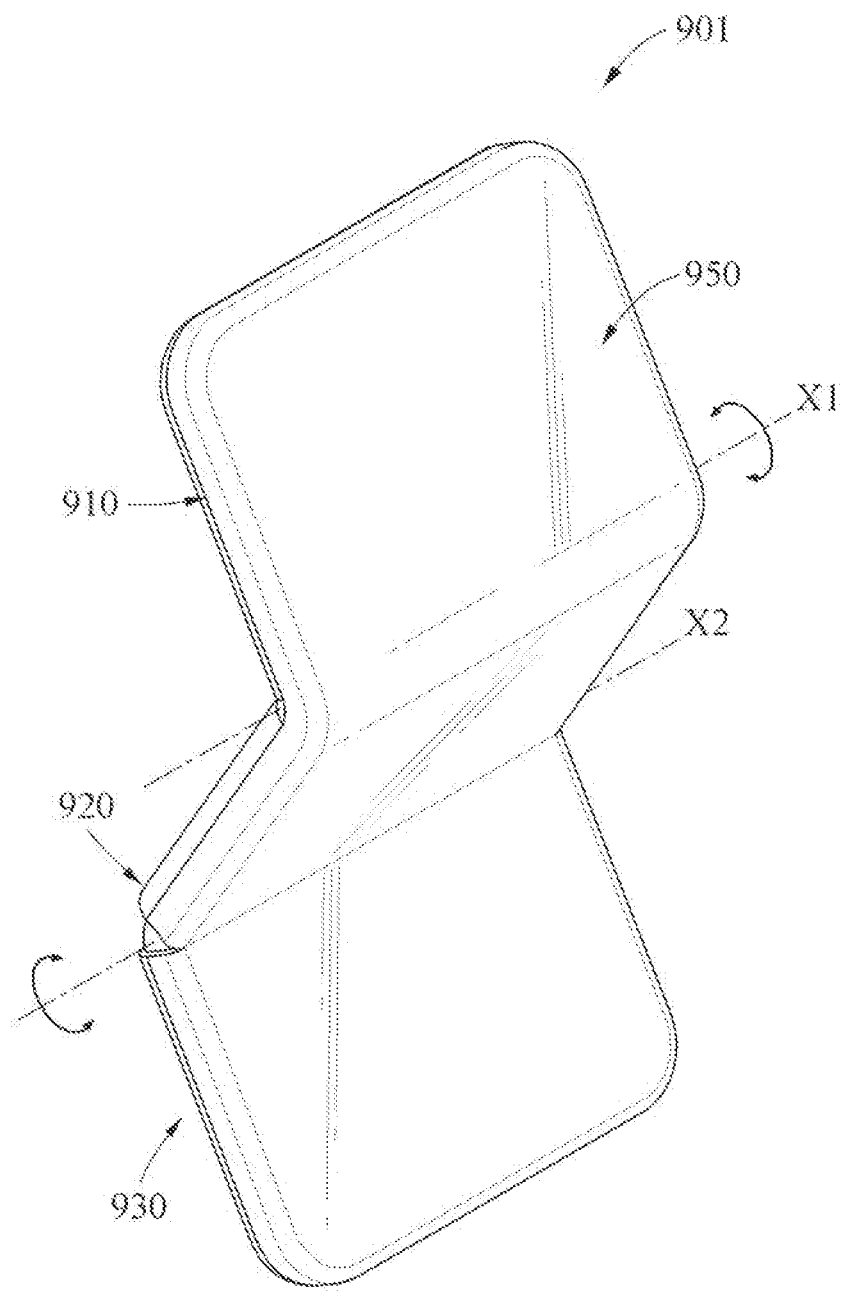
FIG. 9B is a view illustrating an intermediate folded state of the foldable electronic device according to an embodiment.
Figure 9C:
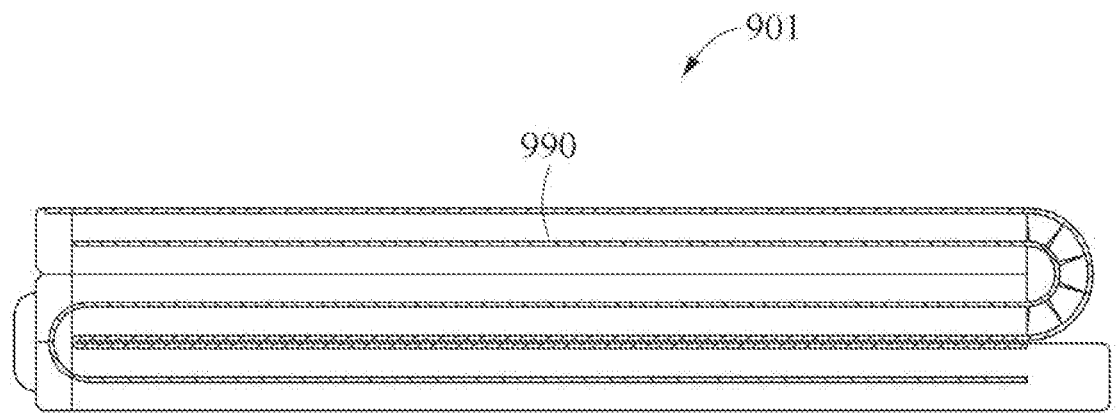
FIG. 9C is a cross-sectional view illustrating a second state of the foldable electronic device according to an embodiment.
Figure 9D:
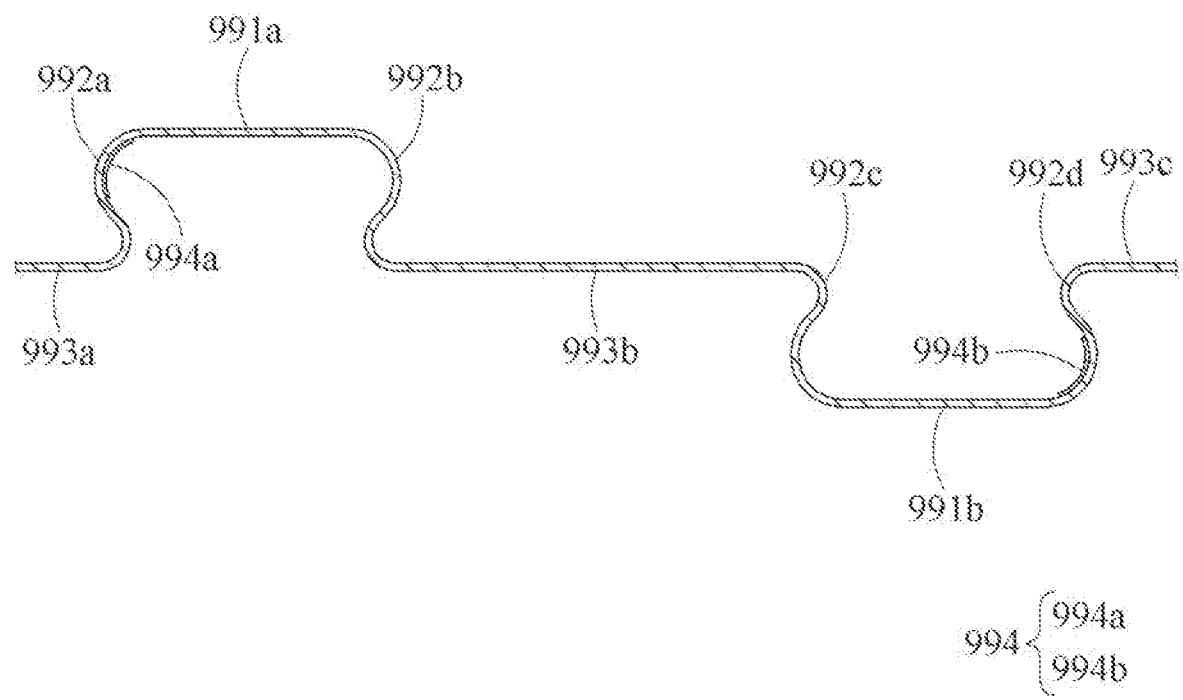
FIG. 9D is a view of an FPCB according to an embodiment.

FIG. 9A is a view illustrating a first state of a foldable electronic device according to embodiments, FIG. 9B is a view illustrating an intermediate folded state of the foldable electronic device according to embodiments, FIG. 9C is a cross-sectional view illustrating a second state of the foldable electronic device according to embodiments, and FIG. 9D is a view of an FPCB according to embodiments.

Referring to FIGS. 9A to 9D, an electronic device (e.g., the electronic device 101 of FIG. 1) in an embodiment may secure high portability by implementing folding operations multiple times through folding axes X1 and X2. In embodiments, a foldable electronic device 901 may include a plurality of housings 910, 920, and 930, at least one hinge structure 930*a* or 930*b* that foldably connects the housings 910 to 920 or 920 to 930 adjacent to each other, a display 950, an FPCB 990 arranged inside the foldable electronic device 901 to traverse the folding axes X1 and X2, a sensor, and a processor (e.g., the processor 120 of FIG. 1).

In embodiments, the plurality of housings 910, 920, and 930 may be connected to each other and may form the exterior of the foldable electronic device 901. For example, the foldable electronic device 901 may include the first housing 910, the second housing 920, and the third housing 930. A space in which a component of the foldable electronic device 901 is arranged may be formed inside each of the housings 910, 920, and 930.

In embodiments, the at least one hinge structure 930*a* or 930*b* may foldably connect a pair of adjacent housings to each other. For example, the at least one hinge structure 930*a* or 930*b* may include a first hinge structure 930*a* that foldably connects the first housing 910 to the second housing 920 based on the first folding axis X1 and a second hinge structure 930*b* that foldably connects the second housing 920 to the third housing 930 based on the second folding axis X2. In embodiments, the first folding axis X1 may be parallel with the second folding axis X2. In embodiments, as illustrated in FIG. 9B, a folding direction of the first housing 910 and the second housing 920 through the first folding axis X1 may be opposite to a folding direction of the second housing 920 and the third housing 930 through the second folding axis X2. On the other hand, the folding direction of the first housing 910 and the second housing 920 through the first folding axis X2 may be the same as the folding direction of the second housing 920 and the third housing 930 through the second folding axis X2.

In embodiments, the display 950 may be arranged on the front surface of the foldable electronic device 901. For example, the display 950 may be arranged to cover at least a partial region of the front surfaces of a plurality of housings 910, 920, and 930 of an electronic device 901 in an unfolded state as illustrated in FIG. 9A. In embodiments, at least a portion of the display 950 may be transformed in response to a folding operation of the foldable electronic device 901. For example, the display 950 may include a first area 950*a* arranged in the front surface of the first housing 910, a second area 950*b* arranged in the front surface of the second housing 920, and a third area 950*c* arranged in the front surface of the third housing 930. In this case, the display 950 may include a first folding area 950*d* between the first area 950*a* and the second area 950*b* and including the first folding axis X1 therein, and a second folding area 950*e* between the second area 950*b* and the third area 950*c* and including the second folding axis X2 therein. In embodiments, as at least a portion of the first folding area 950*d* or the second folding area 950*e* is transformed based on a folding operation of the foldable electronic device 901, the display 950 may fold or unfold in response to the folding operation of the foldable electronic device 901.

In embodiments, the FPCB 990 may be arranged inside the foldable electronic device 901. The FPCB 990 may have a longitudinal direction extending from the first housing 910 to the third housing 930 while traversing the first folding axis X1 and the second folding axis X2. In embodiments, at least a portion of the FPCB 990 may change its shape in response to a change in a folding angle of each of the folding axes X1 and X2 of the foldable electronic device 901. In embodiments, the FPCB 990 may include a first central portion 991*a*, a second central portion 991*b*, a first bending portion 992*a*, a second bending portion 992*b*, a third bending portion 993*c*, a fourth bending portion 992*d*, a first extension portion 993*a*, a second extension portion 993*b*, and a third extension portion 993*c*.

In embodiments, at least a portion of the first central portion may be arranged inside the first hinge structure 930*a* and at least a portion of the second central portion 991*b* may be arranged inside the second hinge structure 930*b*. In embodiments, the first bending portion 992*a* may be connected to the first central portion 991*a* in a direction toward the first housing 910 and the second bending portion 992*b* may be connected to the first central portion 991*a* in a direction toward the second housing 920. At least a portion of the first bending portion 992*a* and the second bending portion 992*b* may bend in response to a change in folding angles of the first housing 910 and the second housing 920 based on the first folding axis X1. In embodiments, the third bending portion 992*c* may be connected to the second central portion 991*b* in a direction toward the second housing 920 and the fourth bending portion 992*d* may be connected to the second central portion 991*b* in a direction toward the third housing 930. At least a portion of the third bending portion 992*c* and the fourth bending portion 992*d* may bend in response to a change in folding angles of the second housing 920 and the third housing 930 based on the second folding axis X2. The first extension portion 993*a* may be connected to the first bending portion 992*a* to be opposite to the first central portion 991*a* and may be partially fixed to the first housing 910. The second extension portion 993*b* may connect the second bending portion 992*b* to the third bending portion 992*c* and may be partially fixed to the second housing 920. The third extension portion 993*c* may be connected to the fourth bending portion 992*d* to be opposite to the second central portion 991*b* and may be partially fixed to the third housing 930.

In embodiments, a first sensing pattern part 994*a* as a pattern via which an electrical signal flows may be formed in at least one of the first bending portion 992a and the second bending portion 992b and a second sensing pattern part 994b as a pattern via which an electrical signal flows may be formed in at least one of the third bending portion 992c and the fourth bending portion 992d. The first sensing pattern part 994a may generate an impedance change based on a change in a folding angle between the first housing 910 and the second housing 920 based on the first folding axis X1 and the second sensing pattern part 994b may generate an impedance change based on a change in a folding angle between the second housing 920 and the third housing 930 based on the second folding axis X2.

In embodiments, the sensor may detect impedance changes of the first sensing pattern part 994a and the second sensing pattern part 994b, respectively. In embodiments, the processor may recognize a folded state of the foldable electronic device 901 based on each of the impedance changes of the first sensing pattern part 994a and the second sensing pattern part 994b detected by the sensor. For example, the processor may operate to recognize a first folding angle between the first housing 910 and the second housing 920 based on an impedance change of the first sensing pattern part 994a and may operate to recognize a second folding angle between the second housing 920 and the third housing 930 based on an impedance change of the second sensing pattern part 994b. In embodiments, the processor may operate to determine and/or perform an operating mode of the foldable electronic device 901 based on the recognized first folding angle and the recognized second folding angle.

Although not described with reference to FIGS. 9A to 9D, configurations described with reference to FIGS. 1 to 8B may apply to embodiments of FIGS. 9A to 9D. For example, configurations of the sensing pattern part illustrated in FIGS. 3C to 5F may apply to a pattern and an arrangement structure of the first sensing pattern part 994a formed in the FPCB 990 and the dummy pattern 750 illustrated in FIGS. 7A and 7B may apply to the FPCB 990. In addition, unless otherwise specified, one of ordinary skill in the art may easily combine embodiments described with reference to the drawings unless physically impossible.

Hereinafter, an embodiment of an operation of a foldable electronic device is described. In describing the operation of the electronic device, it may be understood that a description which is the same as the aforementioned description is the same though omitted.

Figure 10A:
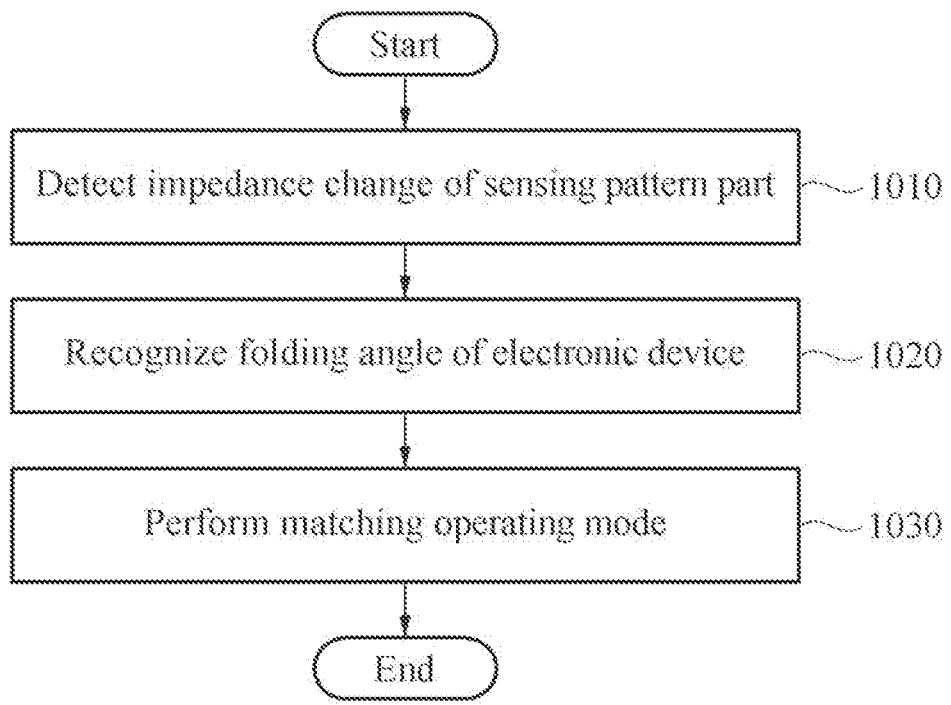
FIGS. 10A, 10B and 10C are flowcharts of an operating method of a foldable electronic device, according to an embodiment.
Figure 10B:
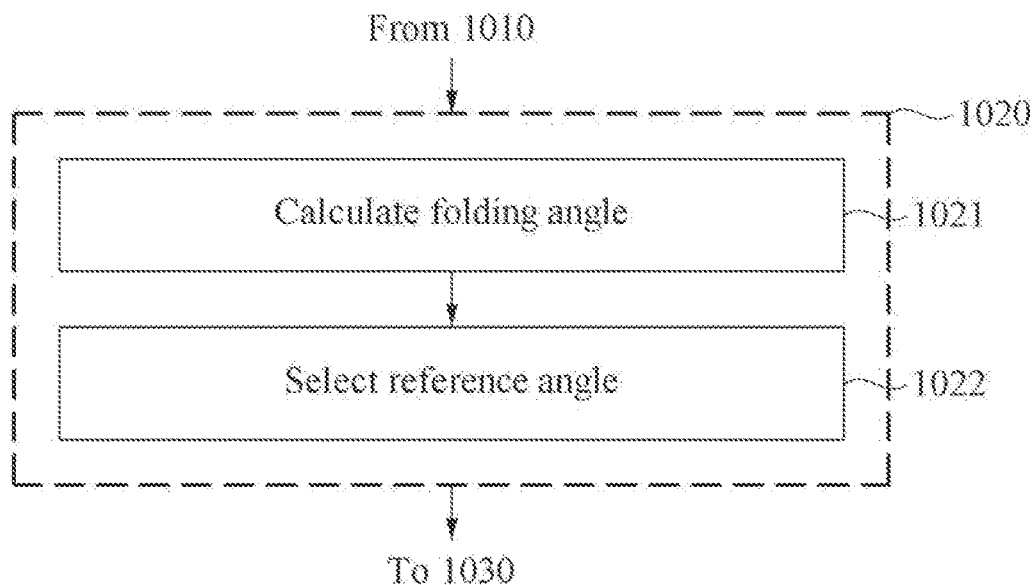
Figure 10C:
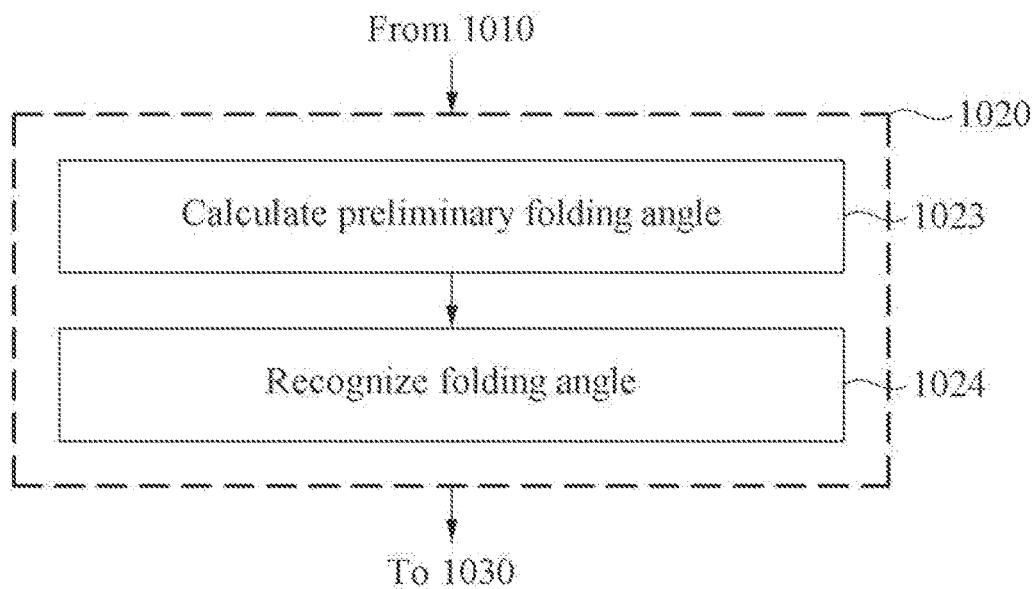

FIGS. 10A to 10C are flowcharts of an operating method of a foldable electronic device, according to embodiments. Referring to FIGS. 10A to 10C, an embodiment of an operation of a foldable electronic device (e.g., the foldable electronic device 301 of FIG. 3A) is described.

In the following example embodiments, operations may be performed sequentially, but are not necessarily performed sequentially. For example, the order of the operations illustrated in FIGS. 10A to 10C may change, and at least two of the operations may be performed in parallel. In addition, each operation is not necessarily performed, and at least one operation may be excluded, according to embodiments.

In embodiments, operations illustrated in FIGS. 10A to 10C may be performed by at least one component (e.g., the processor 120 of FIG. 1) of the foldable electronic device.

In operation 1010, a processor may sense an impedance change of the sensing pattern part 394. For example, the processor may obtain information on an impedance change of the sensing pattern part 394 detected through a sensor. In embodiments, when a folding angle changes based on an opening and closing operation of the foldable electronic device 301, the sensor may detect impedance change information of the sensing pattern part 394 arranged in the bending portion 392 of the FPCB 390 of which at least a portion bends in response to a folding operation of the foldable electronic device. In embodiments, the sensing pattern part 394 may include a first pattern 3941 via which an electrical signal may be set to flow in a direction perpendicular to the surface of the FPCB 390 and a direction parallel with the surface of the FPCB 390, and a second pattern 3942 via which an electrical signal may be set to flow in a direction parallel with the surface of the FPCB 390. The sensor may detect impedance change information based on a mutual impact of electrical signals respectively flowing in the first pattern 3941 and the second pattern 3942. In embodiments, the sensor may operate to provide the detected impedance change information of the sensing pattern part 394 to the processor.

In operation 1020, the processor may recognize a folding angle of the foldable electronic device based on the detected impedance change information of the sensing pattern part 394. For example, the processor may include operation 1021 of recognizing (i.e., calculating) a folding angle based on the detected impedance change information of the sensing pattern part 394. In embodiments, in operation 1021, the processor may calculate the folding angle by applying the impedance change information of the sensing pattern part 394 to a set algorithm. In embodiments, the processor may include operation 1022 of selecting a reference angle from reference angles which are set based on the calculated folding angle. In embodiments, in operation 1022, the processor may set a plurality of reference angles and may select a reference angle that is closest to the calculated folding angle from the plurality of reference angles. In embodiments, in operation 1030, the processor may perform an operating mode that matches the selected reference angle.

In embodiments, when a plurality of sensing pattern parts 894a and 894b is formed in the FPCB 890, in operation 1020, the processor may calculate a folding angle based on impedance changes of the plurality of sensing pattern parts 894a and 894b. In embodiments, in operation 1020, the processor may obtain information on impedance changes of the plurality of sensing pattern parts 894 through the sensor and may calculate a plurality of preliminary folding angles based on the obtained information of impedance changes. For example, when the sensor detects impedance changes of the first sensing pattern part 894a and the second sensing pattern part 894b, the processor may perform operation 1023 of respectively calculating a first preliminary folding angle based on the impedance change of the first sensing pattern part 894a and a second preliminary folding angle based on the impedance change of the second sensing pattern part 894b. In embodiments, the processor may perform operation 1024 of recognizing a folding angle of the foldable electronic device based on the plurality of calculated preliminary folding angles. For example, in operation 1024, the processor may recognize a mean value of the plurality of preliminary folding angles as a folding angle. However, this is an example, and the processor may recognize a median value of the plurality of preliminary folding angles as the folding angle or may recognize the folding angle in a different method.

In embodiments, in operation 1020, when the sensor detects an impedance change of the dummy pattern 795, the processor may recognize the folding angle by correcting impedance change information of the dummy pattern 795 with the impedance change information of the sensing pattern part 794.

In operation 1030, among various set operating modes, the processor may perform an operating mode that matches the recognized folding angle. For example, when the processor recognizes that the foldable electronic device is in the second state (e.g., the folded state of FIG. 2B), the processor may perform an operating mode to turn off a screen of the display. When the processor recognizes that the foldable electronic device is in the first state (e.g., the unfolded state of FIG. 2A), the processor may perform an operating mode to turn on the screen of the display. In embodiments, the processor may perform an operating mode to control the screen of the display to match the folding angle of the foldable electronic device. The above description of the operating mode is an example and the operating mode performed by the processor is not limited thereto.

Figure 11:
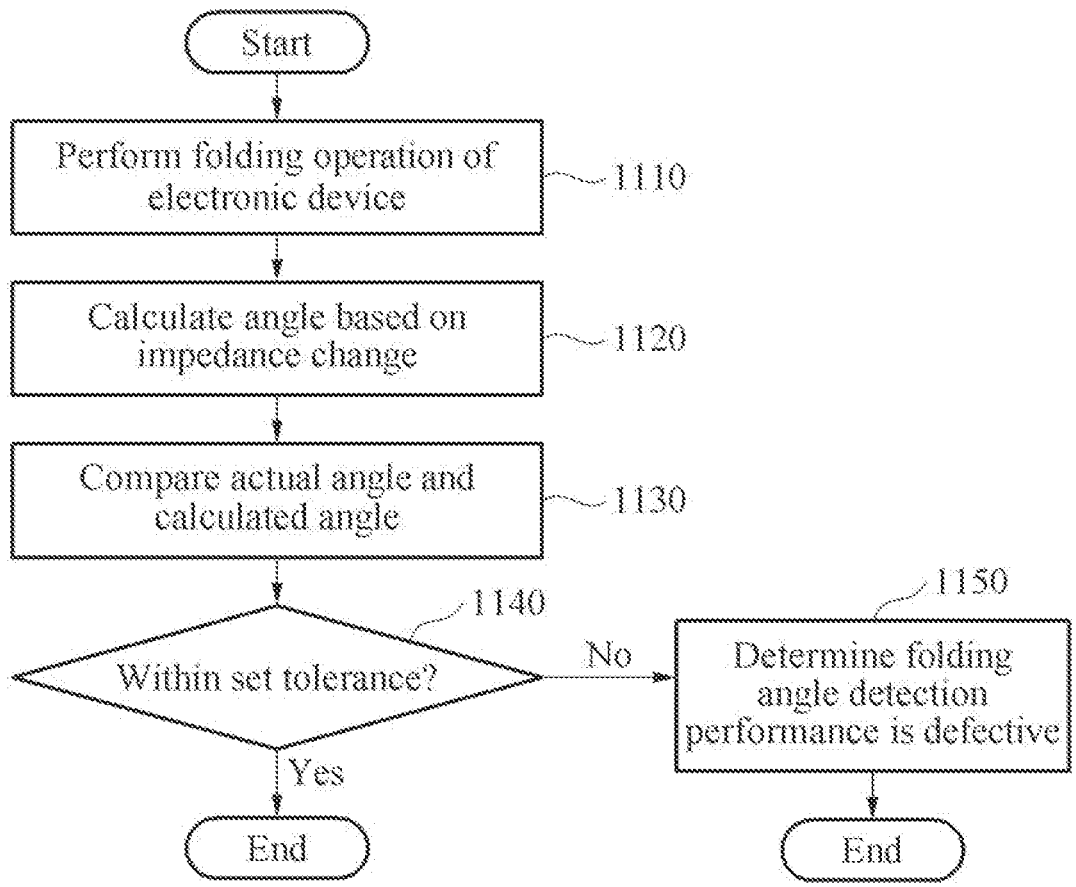
FIG. 11 is a flowchart of a defect inspection method of a foldable electronic device, according to an embodiment.

FIG. 11 is a flowchart of a defect inspection method of a foldable electronic device, according to embodiments.

Referring to FIG. 11, a method of inspecting a defect of folding angle recognition performance of the foldable electronic device 501 is described. The method of inspecting a defect of the foldable electronic device 501 may be performed by an external device operatively connected to the foldable electronic device 501. The external device may include, for example, a jig for changing a folding angle of the foldable electronic device 501, wherein the foldable electronic device 501 is mounted on the jig, and a detector for detecting an actual folding angle of the foldable electronic device 501.

In operation 1110, the external device may perform a folding operation of the foldable electronic device 501 mounted on the jig. For example, the external device may sequentially change an angle of the foldable electronic device 501 based on a set angle.

In operation 1120, the foldable electronic device 501 may recognize a folding angle based on an impedance change of the sensing pattern part 594 and may provide the recognized folding angle to the external device.

In operation 1130, the external device may compare an actual folding angle of the foldable electronic device 501 to the calculated angle recognized by the foldable electronic device 501. In embodiments, the external device may perform operation 1140 of determining whether a difference between the actual folding angle and the calculated folding angle by the foldable electronic device 501 is within a set tolerance. In operation 1040, when the angle difference is within a set tolerance, the external device may determine that there is no abnormality in the folding angle detection performance of the foldable electronic device 501. On the other hand, when the angle difference exceeds the set tolerance, the external device may perform operation 1150 of determining that the folding angle detection performance of the foldable electronic device 501 is defective.

In embodiments, a foldable electronic device may include a display including a first area and a second area, a first housing forming a first space on a rear surface of the first area, a second housing forming a second space on a rear surface of the second area, a hinge structure rotatably connecting the first housing to the second housing based on a folding axis and adjusting a folding angle formed by the first housing and the second housing, an FPCB extending from the first space to the second space while traversing the folding axis and including a first bending portion and a second bending portion of which at least a portion bends in response to a change in the folding angle, a sensor configured to detect an impedance occurring in the FPCB, and a processor.

In embodiments, the FPCB may be arranged in at least one of the first bending portion and the second bending portion and may include at least one sensing pattern part including a first pattern forming a first path through which an electrical signal flows and a second pattern forming a second path through which an electrical signal flows. In embodiments, the sensor may detect an impedance change from the sensing pattern part, and the processor may be configured to recognize the folding angle based on an impedance change detected by the sensor.

In embodiments, the first pattern may be formed to cause an electrical signal flowing in the first path to move in a first direction perpendicular to a surface of the FPCB and a direction parallel with the surface of the FPCB, and the second pattern may be formed to cause an electrical signal flowing in the second path to move in parallel with the surface of the FPCB.

In embodiments, the first pattern may include a plurality of vertical conductive lines arranged in the first direction perpendicular to the surface of the FPCB, and at least one horizontal conductive line arranged in a direction parallel with the surface of the FPCB and connected to the plurality of vertical conductive lines.

In embodiments, at least some of the plurality of vertical conductive lines may include vias.

In embodiments, the FPCB may include a plurality of layers stacked in the first direction perpendicular to the surface of the FPCB, and the first pattern may include horizontal conductive lines respectively formed in some of the plurality of layers, and a via penetrating the plurality of layers to connect adjacent horizontal conductive lines to each other.

In embodiments, the second pattern may include a plurality of first conductive lines spaced apart from each other and extending in a second direction parallel with the surface of the FPCB, and at least one second conductive line connecting adjacent first conductive lines to one another.

In embodiments, the second direction may be perpendicular to the folding axis.

In embodiments, the FPCB may include a plurality of layers stacked in the first direction perpendicular to the surface of the FPCB, and the second pattern may be arranged in a layer forming the surface of the FPCB.

In embodiments, the hinge structure may include a hinge housing including a hinge along the folding axis and forming a hinge space, wherein the FPCB may further include a central portion of which at least a portion is arranged in the hinge space, a first bending portion is connected to an end of the central portion extending to the first space, and a second bending portion is connected to an end of the central portion extending to the second space, a first extension portion extending from the first bending portion in a direction opposite to the central portion and including a first fixing part of which at least a portion is fixed to the first space, and a second extension portion extending from the second bending portion in a direction opposite to the central portion and including a second fixing part of which at least a portion is fixed to the second space.

In embodiments, based on the at least one sensing pattern part, the first pattern may be arranged closer to the central portion than the second pattern.

In embodiments, the FPCB may further include a dummy pattern arranged in at least one of the first extension portion and the second extension portion, and the sensor may detect an impedance change of the dummy pattern based on a temperature change.

In embodiments, the processor may be further configured to recognize the folding angle by correcting information on the impedance change detected from the sensing pattern part with information on an impedance change detected from the dummy pattern.

In embodiments, the first bending portion and the second bending portion may be arranged closer to the first housing and the second housing, respectively, relative to the folding axis, wherein the sensing pattern part may include a first sensing pattern part arranged in the first bending portion, and a second sensing pattern part arranged in the second bending portion.

In embodiments, one or more of the sensing pattern parts may be arranged on both surfaces of the FPCB.

In embodiments, the processor may be further configured to calculate a first angle based on information on an impedance change detected from the first sensing pattern part, calculate a second angle based on information on an impedance change detected from the second sensing pattern part, and determine the folding angle based on the first angle and the second angle. In embodiments, the folding angle may be between the first angle and the second angle.

In embodiments, an operating method of a foldable electronic device may include detecting information on an impedance change of a sensing pattern part arranged in a bending portion of an FPCB of which at least a portion bends in response to a folding operation of the foldable electronic device. In embodiments, the operating method of the foldable electronic device may include recognizing a folding angle of the foldable electronic device based on the detected impedance change of the sensing pattern part. In embodiments, the operating method of the foldable electronic device may include performing an operating mode that matches the recognized folding angle among set operating modes of the foldable electronic device.

In embodiments, the sensing pattern part may include a first pattern formed to cause an electrical signal to flow in a direction perpendicular to a surface of the FPCB and a direction parallel with the surface of the FPCB, and a second pattern formed to cause an electrical signal to flow in a direction parallel with the surface of the FPCB, wherein the detecting of the information on the impedance change may include detecting information of impedance changes of the first pattern and the second pattern.

In embodiments, the recognizing of the folding angle of the foldable electronic device may include calculating a folding angle based on the detected impedance change of the sensing pattern part. In embodiments, the recognizing of the folding angle of the foldable electronic device may include selecting a reference angle adjacent to the calculated folding angle from set reference angles.

In embodiments, a plurality of sensing pattern parts may be formed in the FPCB, wherein the recognizing of the folding angle of the foldable electronic device may include calculating a plurality of preliminary folding angles based on impedance changes respectively detected from the plurality of sensing pattern parts. The recognizing of the folding angle of the foldable electronic device may include recognizing a mean value of the plurality of calculated preliminary folding angles as the folding angle.

In embodiments, a foldable electronic device may include a display including a first area and a second area, a first housing forming a first space on a rear surface of the first area, a second housing forming a second space on a rear surface of the second area, a hinge structure rotatably connecting the first housing to the second housing based on a folding axis such that a folding angle formed by the first housing and the second housing relative to the folding axis is able to be adjusted, an FPCB extending from the first space to the second space while traversing the folding axis, a sensor configured to detect an impedance occurring in the FPCB, and a processor configured to detect a folding angle based on detection information of the sensor. The hinge structure may include a hinge housing forming a hinge space between the first space and the second space while the display is unfolded. The FPCB may include a central portion of which at least a portion is arranged in the hinge space, a first bending portion connecting to an end of the central portion toward the first space wherein at least a portion of the first bending portion bends, a second bending portion connecting to an end of the central portion toward the second space wherein at least a portion of the second bending portion bends, and a sensing pattern part arranged in at least one of the first bending portion and the second bending portion. The sensing pattern part may include a first pattern formed to cause an electrical signal to flow in a direction perpendicular to a surface of the FPCB and a direction parallel with the surface of the FPCB, and a second pattern formed to cause an electrical signal to flow in a direction parallel with the surface of the FPCB.

In embodiment, a non-transitory computer readable medium having instructions stored therein, which when executed by a processor cause the processor to execute a method of controlling a foldable electronic device, the method including: identifying an impedance of a sensing pattern part provided in a bending portion of a flexible printed circuit board (FPCB) in response to a folding operation of the foldable electronic device; identifying a folding angle of the foldable electronic device based on the impedance of the sensing pattern part; and changing an operating mode of the foldable electronic device based on the folding angle.

In embodiment, a foldable electronic device including: a display; a first housing on a first area of the display; a second housing on a second area of the display; a hinge rotatably connecting the first housing with the second housing; a flexible printed circuit board (FPCB) extending from a first space between the first area and the first housing to a second space between the second area and the second housing; and a processor configured to: identify a folding angle between the first housing and the second housing based on a first impedance in the FPCB.

In embodiment, the processor may be further configured to identify the folding angle based on the first impedance and a second impedance in the FPCB.

In embodiment, the foldable electronic device may further include a first sensing pattern provided in a first bending portion of the FPCB; and a reference pattern provided in the FPCB. The processor may be further configured to identify the first impedance based on the first sensing pattern and the second impedance based on the reference pattern.

In embodiment, a shape of the reference pattern may be constant throughout a folding operation of the foldable electronic device.

In embodiment, the foldable electronic device may further include a second sensing pattern provided in a second bending portion of the FPCB. The processor is further configured to identify a third impedance based on the second sensing pattern, and identify the folding angle based on the first impedance, the second impedance and the second impedance.

What is claimed is:
1. A foldable electronic device comprising:
a display comprising a first area and a second area;

a first housing on a rear surface of the first area;
a second housing on a rear surface of the second area;
a hinge structure foldably connecting the first housing and the second housing to each other on a folding axis;
a flexible printed circuit board (FPCB) extending across the folding axis from a first space between the first housing and the display to a second space between the second housing and the display and comprising a first bending portion and a second bending portion, wherein the first bending portion comprises a first sensing pattern part comprising a first pattern forming a first electrical path and a second pattern forming a second electrical path;
a sensor configured to identify an impedance in the FPCB; and
a processor configured to identify a folding angle between the first housing and the second housing based on the impedance,
wherein the first electrical path extends in a first direction perpendicular to a surface of the FPCB, and
wherein the second electrical path extends in a second direction parallel with the surface of the FPCB.

2. The foldable electronic device claim 1, wherein the first pattern comprises:
a plurality of vertical conductive lines extending in the first direction; and
at least one horizontal conductive line extending in the second direction and connected to the plurality of vertical conductive lines.

3. The foldable electronic device claim 2, wherein at least one of the plurality of vertical conductive lines comprises a via.

4. The foldable electronic device claim 1, wherein the FPCB comprises a plurality of layers stacked in the first direction, and
wherein the first pattern comprises:
horizontal conductive lines respectively formed in some of the plurality of layers; and
a via penetrating the plurality of layers to connect adjacent horizontal conductive lines to each other.

5. The foldable electronic device claim 1, wherein the second pattern comprises:
a plurality of first conductive lines spaced apart from each other and extending in the second direction; and
at least one second conductive line connecting adjacent first conductive lines to one another.

6. The foldable electronic device claim 5, wherein the second direction is perpendicular to the folding axis.

7. The foldable electronic device claim 1, wherein the FPCB comprises a plurality of layers stacked in the first direction, and
wherein the second pattern is provided in a layer forming the surface of the FPCB.

8. The foldable electronic device claim 1, wherein the hinge structure comprises a hinge along the folding axis, and
wherein the FPCB further comprises:
a central portion in a hinge space between the hinge and the display, wherein the first bending portion is connected to a first end of the central portion and extends to the first space, and the second bending portion is connected to a second end of the central portion and extends to the second space;
a first extension portion extending from the first bending portion and comprising a first fixing part fixed to the first space; and
a second extension portion extending from the second bending portion and comprising a second fixing part fixed to the second space.

9. The foldable electronic device claim 8, wherein the first pattern is between the central portion and the second pattern.

10. The foldable electronic device claim 1, wherein the FPCB further comprises a dummy pattern, and
wherein the sensor is configured to identify a reference impedance of the dummy pattern.

11. The foldable electronic device claim 10, wherein the processor is further configured to identify the folding angle based on the impedance and the reference impedance.

12. The foldable electronic device claim 1, wherein the second bending portion comprises a second sensing pattern part comprising a third pattern forming a third electrical path and a fourth pattern forming a fourth electrical path.

13. The foldable electronic device claim 12, wherein the first sensing pattern part and the second sensing pattern part are arranged on different surfaces of the FPCB.

14. The foldable electronic device claim 12, wherein the processor is further configured to calculate a first angle based on information on a first impedance of the first sensing pattern part, calculate a second angle based on a second impedance of the second sensing pattern part, and identify the folding angle based on the first angle and the second angle, and
wherein the folding angle is between the first angle and the second angle.

15. An operating method of a foldable electronic device, the operating method comprising:
identifying an impedance of a sensing pattern part provided in a bending portion of a flexible printed circuit board (FPCB) in response to a folding operation of the foldable electronic device;
identifying a folding angle of the foldable electronic device based on the impedance of the sensing pattern part; and
changing an operating mode of the foldable electronic device based on the folding angle,
wherein the sensing pattern part comprises a first pattern forming a first electrical path extending in a first direction perpendicular to a surface of the FPCB and a second pattern forming a second electrical path extending in a second direction parallel with the surface of the FPCB, and
wherein the identifying the impedance comprises detecting a first impedance of the first pattern and a second impedance of the second pattern.

16. The operating method of claim 15, wherein the identifying the folding angle comprises:
identifying a preliminary folding angle based on the impedance; and
selecting a reference angle adjacent to the preliminary folding angle from among a set of reference angles.

17. The operating method of claim 15, wherein the sensing pattern part is one from among a plurality of sensing pattern parts provided in the FPCB, and
wherein the recognizing of the folding angle of the foldable electronic device further comprises:
identifying a plurality of preliminary folding angles based on a plurality of impedances respectively corresponding to the plurality of sensing pattern parts; and
identifying a mean value of the plurality of preliminary folding angles as the folding angle.

18. A foldable electronic device comprising:
a display comprising a first area and a second area;

a first housing on a rear surface of the first area;
a second housing on a rear surface of the second area;
a hinge structure foldably connecting the first housing and the second housing to each other on a folding axis;
a flexible printed circuit board (FPCB) extending across the folding axis from a first space between the first housing and the display to a second space between the second housing and the display;
a sensor configured to identify an impedance in the FPCB; and
a processor configured to identify a folding angle based on the impedance,
wherein the hinge structure forms a hinge space between the first space and the second space,
wherein the FPCB comprises:
  a central portion in the hinge space;
  a first bending portion connected to a first end of the central portion;
  a second bending portion connected to a second end of the central portion; and
  a sensing pattern part provided in the first bending portion, and
wherein the sensing pattern part comprises:
  a first pattern extending in a first direction perpendicular to a surface of the FPCB; and
a second pattern extending in a second direction parallel with the surface of the FPCB.

* * * * *